US011083112B2

(12) United States Patent
Thao et al.

(10) Patent No.: US 11,083,112 B2
(45) Date of Patent: Aug. 3, 2021

(54) THREE-PHASE ELECTRONIC CONTROL UNIT FOR ENCLOSURE AIR CONDITIONERS

(71) Applicant: Hoffman Enclosures, Inc., Anoka, MN (US)

(72) Inventors: Shawn A. Thao, Vadnais Heights, MN (US); Mark J. Sowada, Plymouth, MN (US); Michael Rasmussen, Ramsey, MN (US); Jason Dickmann, Champlin, MN (US); Victor Divine, Forest Lake, MN (US); William J. Hanson, Edina, MN (US)

(73) Assignee: Hoffman Enclosures, Inc., Anoka, MN (US)

( * ) Notice: Subject to any disclaimer, the term of this patent is extended or adjusted under 35 U.S.C. 154(b) by 0 days.

(21) Appl. No.: 16/520,180

(22) Filed: Jul. 23, 2019

(65) Prior Publication Data

US 2020/0060048 A1    Feb. 20, 2020

Related U.S. Application Data

(60) Provisional application No. 62/702,224, filed on Jul. 23, 2018.

(51) Int. Cl.
*H05K 7/20* (2006.01)
*F25B 49/02* (2006.01)
(Continued)

(52) U.S. Cl.
CPC ....... *H05K 7/20836* (2013.01); *F25B 49/022* (2013.01); *F25B 49/025* (2013.01);
(Continued)

(58) Field of Classification Search
CPC .... H02H 11/002; H02H 11/004; H02H 7/097; H05K 7/20836; G06F 1/206; H02M 7/04;
(Continued)

(56) References Cited

U.S. PATENT DOCUMENTS

| 3,976,919 A | 8/1976 | Vandevier et al. |
| 5,086,266 A | 2/1992 | Shiga et al. |

(Continued)

FOREIGN PATENT DOCUMENTS

| CN | 103375889 A | 10/2013 |
| CN | 105700450 A | 6/2016 |

(Continued)

OTHER PUBLICATIONS

Rittal. Blue e+ Cooling Units. Webpage. Accessed on Nov. 6, 2020 at https://www.rittal.us/contents/blue-e-cooling-units/.

*Primary Examiner* — Thienvu V Tran
*Assistant Examiner* — Shahzeb K Ahmad
(74) *Attorney, Agent, or Firm* — Quarles & Brady LLP

(57) ABSTRACT

A thermal management system for an enclosure containing electrical components includes a cooling unit for controlling temperature inside the enclosure and a controller for the cooling unit, the controller being configured so that it can receive a three-phase power input signal and distribute power and control connected components using the three-phase signal. The controller can protect the compressor in critical scenarios such as thermal overload and overcurrent. The controller can output various faults such as missing phase alarm, imbalance phase alarm, overcurrent alarm, thermal overload alarm, door open alarm, and temperature and pressure alarms. An auto phase sequence correction controls the phase relay, accepting 3 phase 480 VAC power input from facility power terminal, supplying 3 phase power to the compressor and motor impellers, 12V DC power to a (Continued)

display unit, and 24V DC power to a remote access control module.

19 Claims, 16 Drawing Sheets

(51) Int. Cl.
G06F 1/20 (2006.01)
H02H 11/00 (2006.01)
H02H 7/097 (2006.01)
(52) U.S. Cl.
CPC .............. *G06F 1/206* (2013.01); *H02H 7/097* (2013.01); *H02H 11/002* (2013.01); *H02H 11/004* (2013.01)
(58) Field of Classification Search
CPC ........ H02M 7/043; H02M 7/06; H02M 7/062; H02M 1/32; H02M 1/36; F25B 49/022; F25B 49/025
See application file for complete search history.

(56) References Cited

U.S. PATENT DOCUMENTS

| | | | |
|---|---|---|---|
| 5,828,309 A * | 10/1998 | Kumakura | H02H 7/097 340/658 |
| 6,150,792 A * | 11/2000 | Andersson | H02H 7/097 318/806 |
| 6,184,795 B1 * | 2/2001 | Johnson | H02H 7/0833 318/490 |
| 8,072,170 B2 | 12/2011 | Hwang et al. | |
| 8,169,180 B2 | 5/2012 | Hwang et al. | |
| 8,299,646 B2 | 10/2012 | Rockenfeller et al. | |
| 8,299,653 B2 | 10/2012 | Rockenfellet et al. | |
| 8,368,337 B2 | 2/2013 | Bonilla et al. | |
| 9,228,750 B2 | 1/2016 | Rockenfeller et al. | |
| 2009/0160378 A1 | 6/2009 | Hwang et al. | |
| 2011/0016915 A1 | 1/2011 | Rockenfeller et al. | |
| 2015/0180327 A1 | 6/2015 | Matsuda | |
| 2017/0261246 A1 | 9/2017 | Park et al. | |
| 2017/0300107 A1 * | 10/2017 | Green | H02M 1/32 |
| 2017/0302200 A1 * | 10/2017 | Marcinkiewicz | F25B 49/025 |
| 2020/0056821 A1 * | 2/2020 | Hirosawa | F25B 49/022 |
| 2020/0408430 A1 * | 12/2020 | Yamakawa | F24F 11/65 |

FOREIGN PATENT DOCUMENTS

| | | |
|---|---|---|
| CN | 206037339 U | 3/2017 |
| DE | 102005016721 A1 | 10/2006 |
| JP | 2008187819 A * | 8/2008 |
| JP | 2008187819 A | 8/2008 |
| KR | 20090039482 A | 4/2009 |
| WO | 2016035982 A1 | 3/2016 |
| WO | 2018131120 A1 | 7/2018 |

* cited by examiner

THREE-PHASE ELECTRONIC CONTROL UNIT FOR ENCLOSURE AIR CONDITIONERS

RELATED APPLICATIONS

This application is based on, claims priority to, and incorporates herein by reference in its entirety, U.S. Provisional Application Ser. No. 62/702,224, filed Jul. 23, 2018, and entitled "Three-Phase Electronic Control Unit for Enclosure Air Conditioners."

BACKGROUND

Thermal management systems are often used to provide cooling to electronic and electrical components, such as in manufacturing controls, telecom equipment, data networks, and/or other vital systems to optimize operating conditions of the electronic and electrical components. A typical thermal management system for cooling an electronic equipment enclosure may include one or more cooling units, a controller, and an enclosure housing the cooling units and/or the controller.

A main enclosure containing the electrical and electronic components that are to be cooled may be fireproof, which requires precise, low-tolerance design to protect the components. The cooling unit(s) are mounted within the main enclosure and may include a fan and a heat sink for removing heat from the main enclosure. The controller generally provides commands to the cooling units through an electrical signal, while power for the cooling units is provided from a separate power source. In some systems, the cooling units may connect to mains power or to a higher-voltage alternating-current (AC) power source. Cooling units can be single-phase or three-phase units, according to the method of receiving power from the AC power source.

The controller, even for three-phase cooling units, is single-phase in existing thermal management systems for electrical equipment enclosures. Where the controller is single-phase and the cooling units are three-phase, care must be taken during installation to properly electrically interconnect the components. Additionally, the controller is preferably equipped to address the mismatch and to monitor and correct phase issues that arise. For example, the controller can include an additional transformer for each of the cooling unit components having a three-wire connection, including some or all of the compressor, motor impellers, displays, etc. In another example, the controller can include a phase voltage monitor, and associated alerting circuitry, for detecting and reporting missing or imbalanced phase voltage.

SUMMARY

A three-phase system of cooling units is preferred to a single-phase system because it has double the current transmission capacity of a single-phase system with the same inputs, outputs, and composition. Accordingly, it would be useful to provide an electronic control unit (i.e., "controller") that also operates on a three-phase AC power supply, in order to eliminate the above-described, and other, disadvantages of a mismatched-phase thermal management system. The three-phase controller described herein provides improved performance with reduced complexity and lower cost compared to similar existing single-phase controllers.

The three-phase controller provides the ability to control and manage the electrical equipment enclosure air temperature in terms of cooling and heating modes, and protects the system compressor in critical scenarios, such as during thermal overload and overcurrent conditions. In addition, the three-phase controller has the ability to output various faults to alert end-users when faults occurred, such as missing phase alarm, imbalance phase alarm, overcurrent alarm, thermal overload alarm, door open alarm, high/low temperature alarm, frost alarm, enclosure air inlet temperature sensor failure alarm, enclosure air outlet temperature sensor failure alarm, condenser coil temperature sensor alarm, high pressure alarm, low pressure alarm, serious high pressure shutdown. The three-phase controller may include a phase relay that controls an automatic phase sequence correction. The three-phase controller accepts three-phase 480 VAC power input from facility power terminal, supplies three-phase power to the evaporator motor impeller, condenser motor impeller, and compressor, supplies 12V power input to a display unit (DU), and supplies 24V power input to a remote access control module.

In one embodiment, the invention provides a thermal management system for an enclosure containing electrical components. The thermal management system includes: a cooling unit mounted on the enclosure such that the cooling unit cools an interior space of the enclosure, the cooling unit having a fan for driving air into the interior space, the cooling unit including a housing; and, a controller in electrical communication with the cooling unit and configured to operate one or more components of the cooling unit using a three-phase power input signal.

In another embodiment, a thermal management system for an enclosure containing electrical components is provided. The thermal management system includes a cooling unit mounted on the enclosure such that the cooling unit cools an interior space of the enclosure, the cooling unit having an impeller and a compressor, and a control unit in electrical communication with the cooling unit and with a power supply that generates three-phase alternating-current ("AC") input power at an input voltage, the input power including a first phase, a second phase, and a third phase, the control unit a rectification circuit configured to receive the input power and rectify the input power to output a direct current ("DC") output power having a rectified DC voltage, a phase detection circuit coupled to the rectification circuit and configured to output a plurality of phase sequence signals indicating an order of the first, second, and third phases, the plurality of phase sequence signals including a first phase signal representing the first phase, a second phase signal representing the second phase, and a third phase signal representing the third phase, a phase correction circuit including a first relay configured to receive the second phase and the third phase of the input power, and a second relay configured to receive the second phase and the third phase of the input power, the first and second relays being selectively activated to output a corrected second phase and a corrected third phase, the control unit providing to the cooling unit a corrected input power including the first phase, the corrected second phase, and the corrected third phase, and a microcontroller coupled to the phase detection circuit, the phase correction circuit, and the rectification circuit, the microcontroller configured to receive the first phase signal, the second phase signal, and the third phase signal, activate one of the first relay and the second relay based on the first phase signal, the second phase signal, and the third phase signal.

In the system, the control unit may not include a transformer with a primary winding that receives the input power and a secondary winding that provides the corrected input power to at least one of the compressor and the impeller.

The system may further include a current sensing circuit coupled to the rectification circuit and to the phase correction circuit and receiving the first phase, the corrected second phase, and the corrected third phase, and configured to output a digital first phase signal corresponding to a first phase current amplitude, a digital second phase signal corresponding to a corrected second phase current amplitude, and a digital third phase signal corresponding to a corrected third phase current amplitude, and wherein the microcontroller is further configured to receive the first digital current signal, receive the second digital current signal, receive the third digital current signal, determine at least one of the first digital current signal, the second digital current signal, and the third digital current signal are above a predetermined threshold, and determine an overcurrent fault has occurred.

The system may further include a compressor control circuit including at least one switch and coupled to the phase correction circuit and to the microcontroller, the compressor control circuit receiving the corrected second phase and the corrected third phase and configured to selectively provide the corrected second phase and the corrected third phase to the compressor in response to a compressor control signal received from the microcontroller. The current sensing circuit can include a current sensor including a comparator coupled to the rectification circuit and configured to receive a 6 VDC voltage supply from the rectification circuit.

In the system, to activate one of the first relay and the second relay, the microcontroller may send to the phase correction circuit one or both of a forward command signal and a reverse command signal, and the phase correction circuit may be configured to activate the first relay in response to the forward command signal, activate the second relay in response to the reverse command signal, and not activate either the first relay or the second relay when both the forward command signal and the reverse command signal are received.

The system may further include a heater control circuit coupled to the controller and configured to activate a heater in response to a heater control signal, and the controller may be configured to provide the heater control signal to the heater control circuit.

In the system, the rectification circuit may be configured to output a 3.3 VDC voltage supply, a 6 VDC voltage supply, a 12 VDC voltage supply, and a 24 VDC voltage supply. The phase detection circuit may further include at least one high sensitivity op-amp, the phase detection circuit being configured to receive the 3.3 VDC voltage supply and produce a 0.2 VDC voltage supply, the 0.2 VDC voltage supply being coupled to the at least one high sensitivity op-amp, the op-amp configured to compare the 0.2 VDC voltage supply to the first phase. The input voltage may be 460 VAC.

The system further may further include a temperature sensor circuit coupled to a temperature sensor and the microcontroller and configured to output an environmental temperature signal to the microcontroller, and the microcontroller may be further configured to receive the environmental temperature signal, determine that the environmental temperature signal is above a predetermined threshold, and output an alarm.

In yet another embodiment, a thermal management system for an enclosure containing electrical components is provided. The thermal management system includes a cooling unit mounted on the enclosure such that the cooling unit cools an interior space of the enclosure, the cooling unit having an impeller and a compressor. The control unit does not include a transformer with a primary winding that receives the input power and a secondary winding that provides output power to at least one of the compressor and the impeller.

In the system, the control unit can further include a rectification circuit configured to receive the input power and rectify the input power to output a direct current ("DC") output power having a rectified DC voltage, a phase detection circuit coupled to the rectification circuit and configured to output a plurality of phase sequence signals indicating an order of the first, second, and third phases, the plurality of phase sequence signals including a first phase signal representing the first phase, a second phase signal representing the second phase, and a third phase signal representing the third phase, a phase correction circuit comprising a first relay configured to receive the second phase and the third phase of the input power, and a second relay configured to receive the second phase and the third phase of the input power, the first and second relays being selectively activated to output a corrected second phase and a corrected third phase, the control unit providing to the cooling unit a corrected input power comprising the first phase, the corrected second phase, and the corrected third phase, and a microcontroller coupled to the phase detection circuit, the phase correction circuit, and the rectification circuit, the microcontroller configured to receive the first phase signal, the second phase signal, and the third phase signal, and activate one of the first relay and the second relay based on the first phase signal, the second phase signal, and the third phase signal.

The system may further include a current sensing circuit coupled to the rectification circuit and to the phase correction circuit and receiving the first phase, the corrected second phase, and the corrected third phase, and configured to output a digital first phase signal corresponding to a first phase current amplitude, a digital second phase signal corresponding to a corrected second phase current amplitude, and a digital third phase signal corresponding to a corrected third phase current amplitude, and wherein the microcontroller is further configured to receive the first digital current signal, receive the second digital current signal, receive the third digital current signal, determine at least one of the first digital current signal, the second digital current signal, and the third digital current signal are above a predetermined threshold, and determine an overcurrent fault has occurred.

The system may further include a compressor control circuit including at least one switch and coupled to the phase correction circuit and to the microcontroller, the compressor control circuit receiving the corrected second phase and the corrected third phase and configured to selectively provide the corrected second phase and the corrected third phase to the compressor in response to a compressor control signal received from the microcontroller. The current sensing circuit can include a current sensor including a comparator coupled to the rectification circuit and configured to receive a 6 VDC voltage supply from the rectification circuit.

In the system, to activate one of the first relay and the second relay, the microcontroller may send to the phase correction circuit one or both of a forward command signal and a reverse command signal, and the phase correction circuit may be configured to activate the first relay in response to the forward command signal, activate the second relay in response to the reverse command signal, and not activate either the first relay or the second relay when both the forward command signal and the reverse command signal are received.

The system may further include a heater control circuit coupled to the controller and configured to activate a heater in response to a heater control signal, and the controller may be configured to provide the heater control signal to the heater control circuit.

In the system, the rectification circuit may be configured to output a 3.3 VDC voltage supply, a 6 VDC voltage supply, a 12 VDC voltage supply, and a 24 VDC voltage supply. The phase detection circuit may further include at least one high sensitivity op-amp, the phase detection circuit being configured to receive the 3.3 VDC voltage supply and produce a 0.2 VDC voltage supply, the 0.2 VDC voltage supply being coupled to the at least one high sensitivity op-amp, the op-amp configured to compare the 0.2 VDC voltage supply to the first phase, and the input voltage may be 460 VAC.

DETAILED DESCRIPTION

Figure 1:
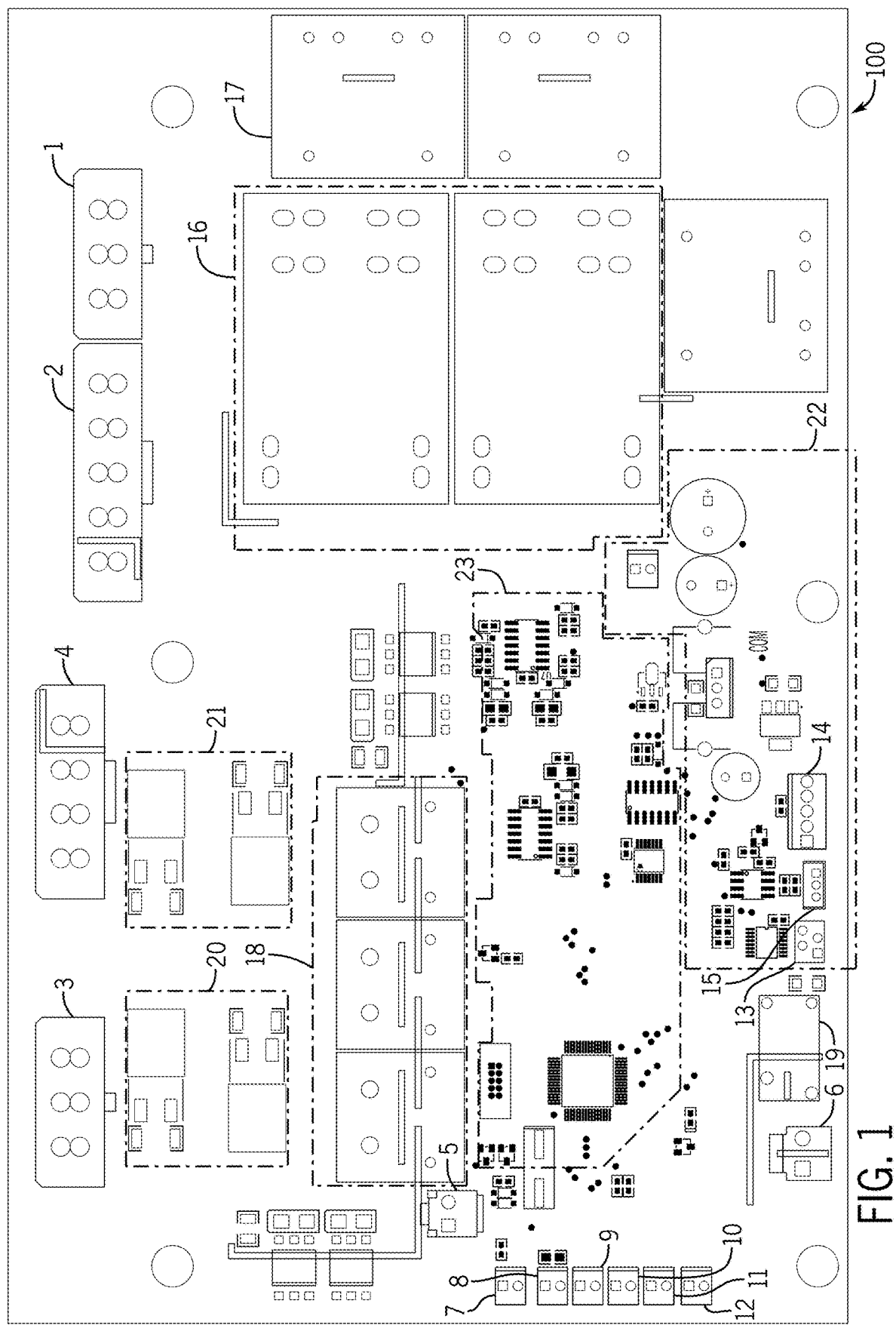
FIG. 1 is a top view diagram of an example embodiment of a printed circuit board (PCB) for an electronic control unit for a thermal management system as described herein.

The inventive electronic control unit (ECU), also referred to interchangeably herein as a controller, overcomes the drawbacks of prior controllers through improvement of control circuits and application of circuit and electrical components, which have not been previously applied in the described manner, in order to provide, for an electronic equipment enclosure air conditioner, an ECU that can receive a three-phase input power connection and distribute power to some or all of the components of a thermal management system including the air conditioner. As a result of the improvements, the inventive controller is more economical, eliminates installation issues, and can operate more efficiently with a simplified power connection to a three-phase air conditioner. Non-limiting examples of three-phase air conditioners that benefit from the present invention include the three-phase models in the line of SPECTRACOOL enclosure air conditioners sold under the HOFFMAN brand name (e.g., SPECTRACOOL SLIM FIT three-phase air conditioners), as well as many other products satisfying industry standards for thermal management systems for electronic equipment enclosures. The air conditioners are described herein primarily as having "cooling" units that manage the temperature of the air in the main enclosure, but it will be understood that, unless otherwise indicated, the air conditioners can be configured, and controlled by the ECU, to provide temperature control in the form of cooled or heated air delivered to the interior of the main enclosure.

Generally, the three-phase ECU is easier to electrically interconnect with the three-phase air conditioner and its cooling units, fans/impellers, and other components, in comparison to previous ECUs, which have a single-phase input power connection. Wiring the ECU to the air conditioner during installation is straightforward, with no tricks required to produce three-phase power for the air conditioner from single-phase power. Correspondingly, the electrical components of previous ECUs that were necessary to produce three-phase power from single-phase power, such as dedicated transformers for the compressor, motor impellers, etc., and a phase voltage monitoring device for controlling the input phase voltage to the air conditioner, are not needed and are eliminated from the three-phase ECU. The transformers for compressor and/or motor impellers can be large an bulky as well as expensive, The three phase ECU only requires smaller and less expensive transformers for current sensing purposes such as phase detection, as will be described below. In addition to providing the advantages of a three-phase input power connection described above, the described ECU improves, among other things: communications with a display unit of the thermal management system; communications with a remote management system and with other ECUs in a multi-unit environment (e.g., via unique RS-485 and Ethernet interfaces); and, protection of the compressor and other air conditioner components through a plurality of monitoring, detection, and alarm generation features.

Figure 2:
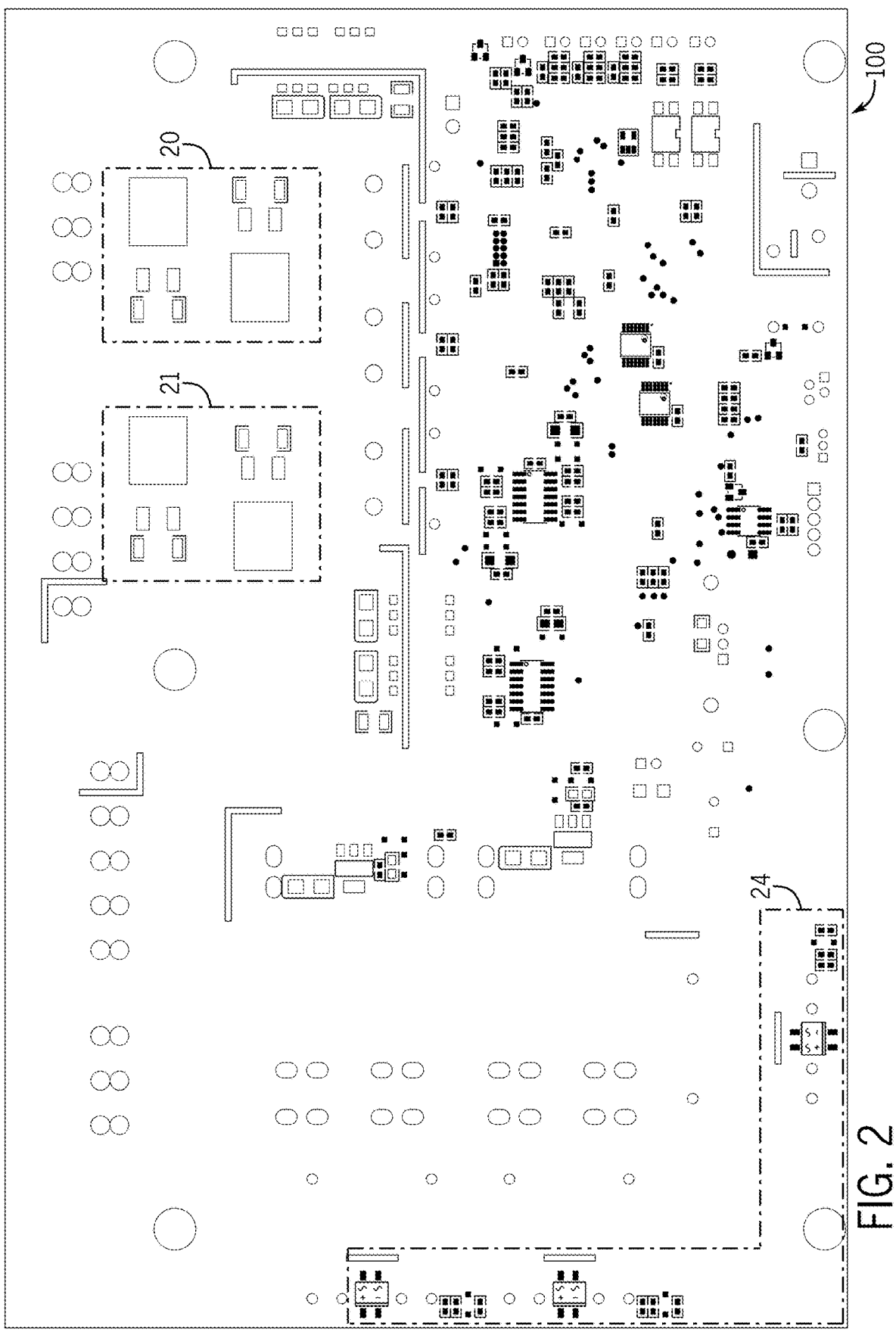
FIG. 2 is a bottom view diagram of the PCB of FIG. 1.

In some embodiments, the ECU may be based on a printed circuit board (PCB). FIGS. 1 and 2 illustrate an example layout 100 of the top side (FIG. 1) and bottom side (FIG. 2) of a PCB for the three-phase ECU. The Figures delineate the positions on the layout 100 of various electrical components, non-limiting examples of which are as follows:

1. Input power interface, for receiving a connector of a three-phase alternating current (AC) power supply of any suitable operational voltage (VAC) (e.g., 280 VAC, 460 VAC, 480 VAC).
2. Evaporator motor impeller (MI) interface, for receiving a connector to the motor of a fan/impeller for an evaporator of the air conditioner and providing power and/or control signals to the motor.
3. Compressor interface, for receiving a connector to the compressor of the air conditioner and providing power and/or control signals to the compressor.
4. Condenser motor impeller (MI) interface, for receiving a connector to the motor of a fan/impeller for a condenser of the air conditioner and providing power and/or control signals to the motor.

5. Compressor thermal overload control interface, for receiving a connector to one or more sensors for detecting properties of the compressor, as described further below.
6. Alarm output/malfunction interface, for receiving a connector to an alarm device, such as a digital or analog audible or visual alarm or an alarm logging/processing computer.
7. Electrical heater control interface, for receiving a connector to an electrical heater that operates during a heating mode of the air conditioner to heat the air in the main enclosure.
8. Enclosure air inlet temperature sensor interface, for receiving a connector to one or more temperature sensors (e.g, thermistor) located at an inlet of the enclosure.
9. Enclosure air outlet temperature sensor interface, for receiving a connector to one or more temperature sensors (e.g, thermistor) located at an outlet of the enclosure.
10. Condenser coil temperature sensor interface, for receiving a connector to one or more temperature sensors (e.g, thermistor) disposed in a location for detecting and/or determining the temperature of the condenser coil.
11. Door switch interface, for receiving a connector to one or more devices, such as actuators, switches, or sensors, that generate a signal based on whether a door of the main enclosure is open or closed.
12. Digital input interface, for receiving a connector to another device, such as a smoke alarm, having a digital output that the ECU may be configured to process.
13. Display unit interface, for receiving a connector to a display unit of the thermal management system.
14. Remote access control interface, for receiving a connector to an associated communications board (e.g., an Ethernet or other network adapter card).
15. RS485 serial bus interface, for receiving a connector to an associated RS485 communications bus that can, in turn, connect to other ECUs as described below.
16. Phase relay connections for receiving a pair of forward and reverse phase relays.
17. Transformer connections for receiving a suitable number of (e.g., three) step-down power transformers.
18. Current sense transformer connections for receiving a transformer for each phase of the three-phase input power, the transformers being used in the current sensing circuits described below.
19. Malfunction relay, for processing an alarm signal in order to send the alarm signal to an external device or circuit (e.g., via the alarm output interface 6).
20. Compressor control integrated circuit (IC) connections for receiving one or more ICs (e.g., application-specific integrated circuits (ASICs), including silicon-controlled rectifier (SCR) circuits) for monitoring and controlling the compressor, as described further below with respect to FIGS. 9-12.
21. Condenser control IC connections for receiving one or more ICs (e.g., ASICs, including SCR circuits) for monitoring and controlling the condenser, as described further below with respect to FIGS. 9-13.
22. Region for connecting components, such as connectors, capacitors, diodes, resistors, and/or ICs, to implement one or more power supply circuits, such as conversion circuits that produce, from the three-phase AC input power, or another power supply, one or more low-voltage direct current (DC) sources (e.g., 24 VDC, 12 VDC, 6 VDC, and 3.3 VDC).
23. Region for connecting components, such as connectors, capacitors, diodes, resistors, and/or ICs, to implement one or more logic control circuits, including those circuits described below unless otherwise indicated.
24. Region for connecting components, such as connectors, capacitors, diodes, resistors, and/or ICs, to implement one or more bridge rectifier circuits that produce rectified DC power from the three-phase AC input power, and deliver the rectified power to one or more of the components attached to the PCB.

Figure 3:
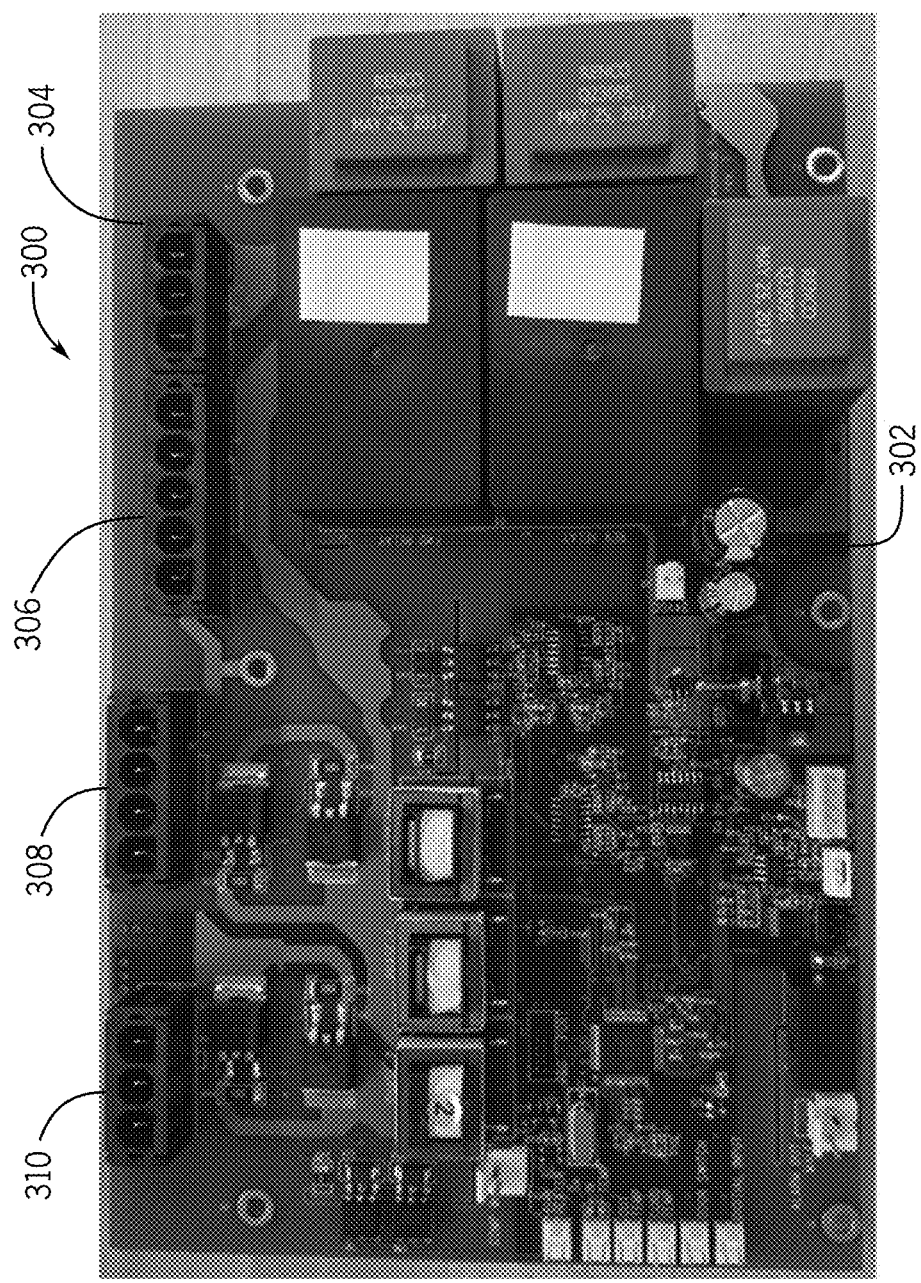
FIG. 3 is a top perspective view of an example embodiment of an electronic control unit (ECU) using the PCB of FIG. 1.
Figure 4:
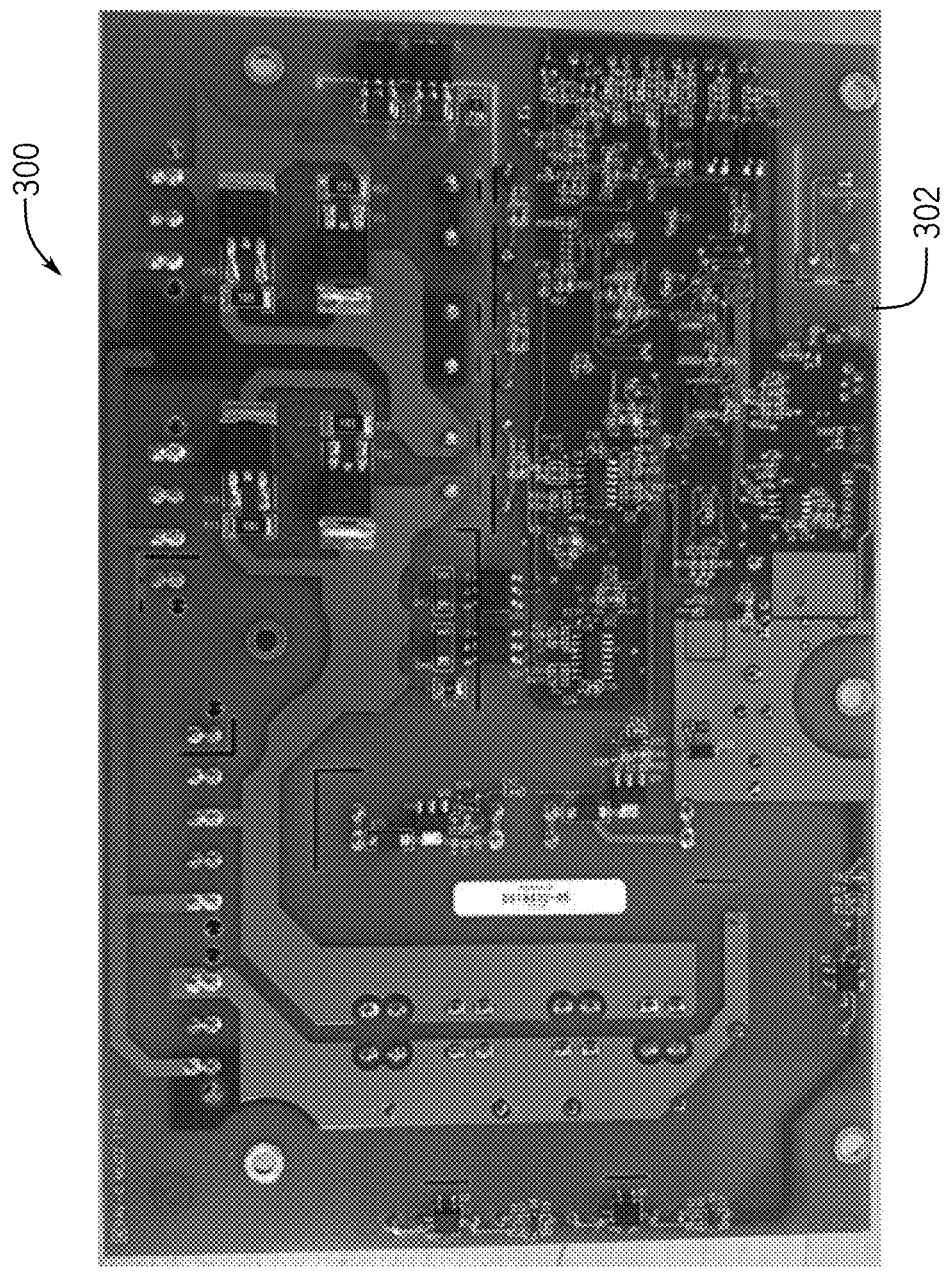
FIG. 4 is a bottom perspective view of the ECU of FIG. 3.

FIGS. 3 and 4 illustrate an example ECU 300 that includes an assembly of the corresponding electrical components attached to a PCB 302 (with the top side illustrated in FIG. 3 and the bottom side in FIG. 4) in accordance with the layout 100 of FIGS. 1 and 2. As illustrated, the connectors to various components may be any suitable connector according to the corresponding component. Non-limiting examples that are illustrated include keyed quick-disconnect female connectors that will only receive a mating male connector disposed in the correct orientation, (see mains power connector 304, evaporator fan connector 306, condenser fan connector 308, and compressor connector 310), and two- or four-pin header connectors, used to connector sensors and communication modules rather than power connections.

Figure 5:
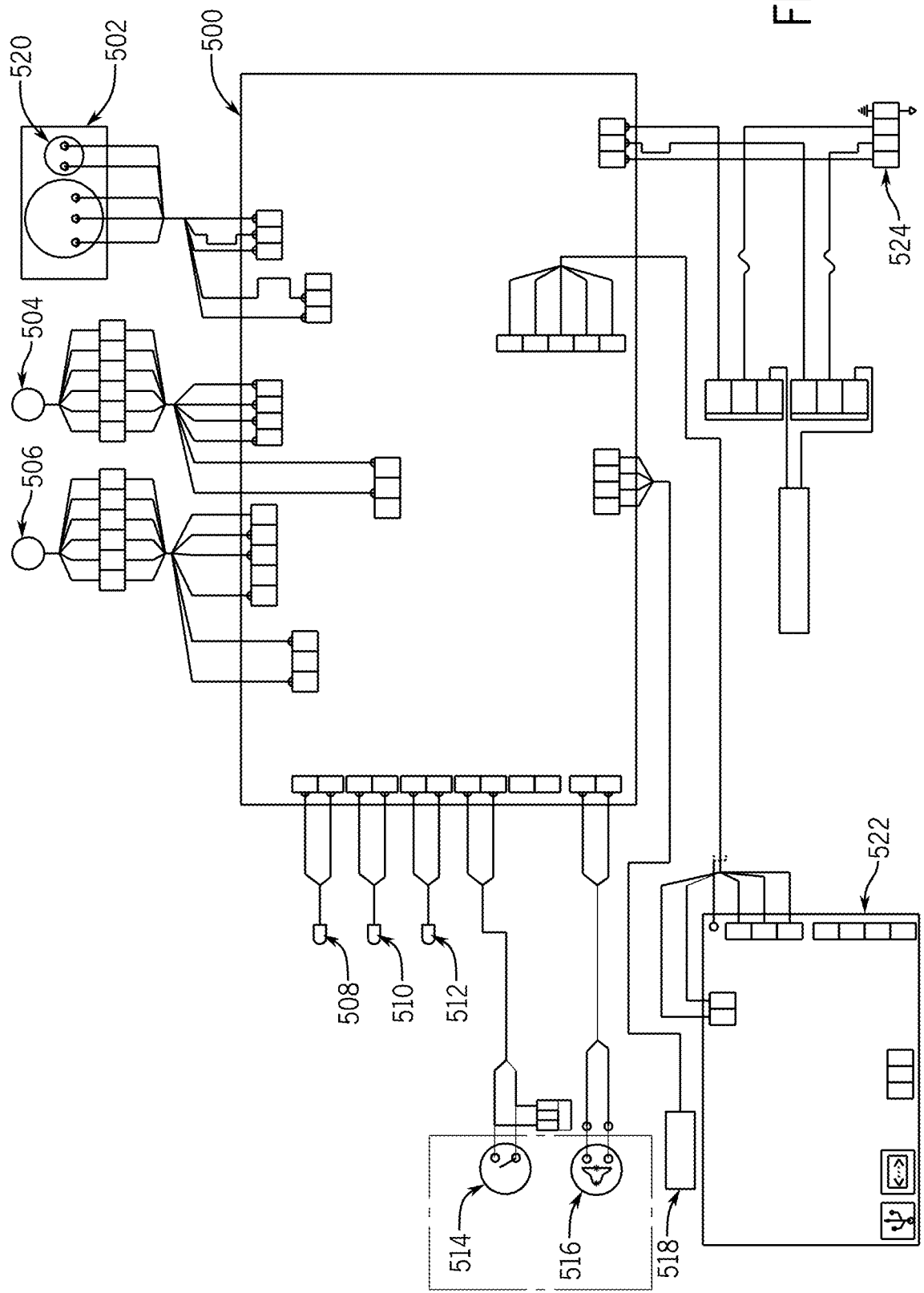
FIG. 5 is a schematic view of a thermal management system using the ECU of FIG. 3.

FIG. 5 illustrates an example ECU 500 in accordance with the above-described figures, shown with potential electrical connections (i.e., at the connectors described above) to other components of the thermal management system. The ECU 500 can contain at least some of the components of the ECU 300 shown above. Non-limiting example components to which the ECU 500 can connect (e.g., as shown) include: a compressor 502, and a compressor overload detector 520; a first impeller 504 on the ambient or outer side of the cooler (not shown); a second impeller 506 on the inner side (i.e., inside the enclosure (not shown)) of the cooler; an inlet thermistor 508; an outlet thermistor 510; a condenser thermistor 512; one or more customer-supplied components, such as a door switch 514 on the enclosure door and a remote alarm 516; a display device 518; a communications board 522; and, a power supply 524, which may also be connected to supply power to the compressor, heater, or another component of the system. The cooler, which may also be referred to as a cooling system, can be a vapor compression type coupling system.

FIGS. 6-19 illustrate example circuit diagrams that are useful for reference when describing the features of the inventive ECU. The ECU provides corrected phases to three phase components such as a compressor and an impeller of a cooling unit without the use of a transformer (i.e. a step down transformer) to reformat input power for the compressor and the impeller. The ECU can receive a three phase input power at a given voltage (i.e. 460 VAC), provide a phase correction to the input power if necessary, and then selectively supply the input power to the compressor and the impeller, both of which operate at the input power voltage (i.e. 460 VAC). Additionally, the ECU can rectify and regulate the input power into a plurality of DC voltages (i.e. 3.3 VDC, 6 VDC, 12 VDC, and 24 VDC) to provide power for other components of the ECU such as a microcontroller without requiring a separate connection from the input power. In summary, the ECU can control power flow to components of the cooling unit without using an large expensive transformer and only requiring a single three phase input power to be installed. Additionally, the ECU is robust to phases that have been installed incorrectly, such as if a second phase of a power supply has been connected to a third phase input of the ECU. The reduced complexity and installation requirements result in an ECU that is less expensive and easier to use than other ECU's, while providing sophisticated protection for components of the cooling unit. The circuits shown in FIGS. 6-19 may be interconnected with at least one other circuit (i.e. a separate figure) even if not explicitly stated.

Figure 6:
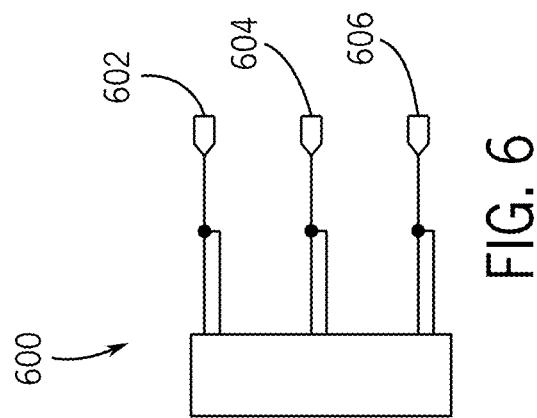
FIG. 6 shows an exemplary input jumper 600 of the ECU of FIG. 3.

Referring to FIG. 6, an input jumper 600 of the ECU is shown. The ECU receives the three-phase input power at the input power supply connector 600. The input power may be supplied over three wires, each associated with a corresponding phase. The first phase L1_MAINS is provided to the ECU at a first input net 602, the second phase L2_MAINS is provided to the ECU at a second input net 604, and the third phase L3_MAINS is provided to the ECU at a third input net 606.

Figure 7:
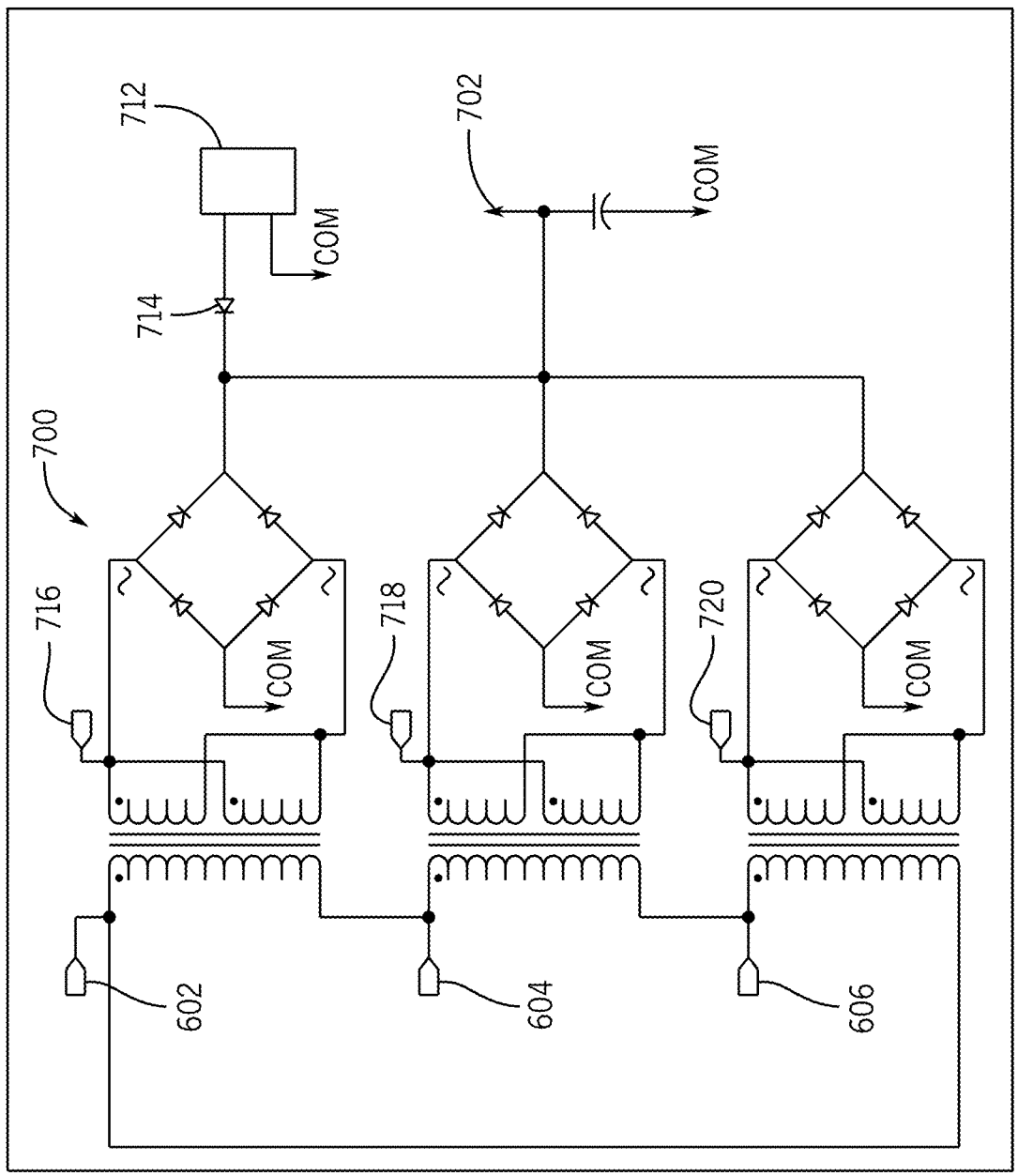
FIG. 7 shows an exemplary transformer-based bridge rectifier circuit of the ECU of FIG. 3.

Referring to FIG. 7, the three-phase AC input power may be rectified (e.g., using a transformer-based bridge rectifier circuit 700) to produce the rectified DC output power DC_OUTPUT used by various components of the ECU (i.e., 3.3 VDC, 6 VDC, 12 VDC). The rectification circuit 700 can regulate the DC output power DC_OUTPUT signal output at DC supply net 702 to one or more specific voltages such as 3.3 VDC at a first DC net 704 (for example, shown in FIG. 8A), 6 VDC at a second DC net 706, a 6 VDC analog signal at third DC net 707 (see FIG. 9), and/or 12 VDC at a fourth DC net 709 (for example shown in FIG. 8B), by connectors, capacitors, diodes, resistors, and/or ICs (not shown) coupled to the DC output power DC_OUTPUT and configured to output a regulated DC output power at a given voltage (i.e. 3.3 VDC). The rectifier circuit 700 can also output a 24VDV voltage source at connector 712 using a Zener diode D32 714 coupled to the DC output power DC_OUTPUT. The DC voltage sources are used throughout the ECU and are shown throughout FIGS. 6-19. Additionally, the rectification circuit 700 may generate a first phase signal PHASE1 for the first phase of the three-phase power at a first phase net 716, a second phase signal PHASE2 for the second phase of the three-phase power at a second phase net 718, and third phase signal PHASE3 for the third phase of the three-phase power at a third phase net 720. The phase signals PHASE1, PHASE2, PHASE3 may be used for phase detection, analysis, and alerting at high voltage or low voltage; for example, if only a low voltage input power is provided (e.g., through an auxiliary power supply connected in place of mains power), the ECU (i.e ECU 300 or ECU500) may be operated in a "test" mode for testing the low-voltage circuit(s) in the ECU and/or for testing programs stored in/by the microprocessor.

Figure 8A:
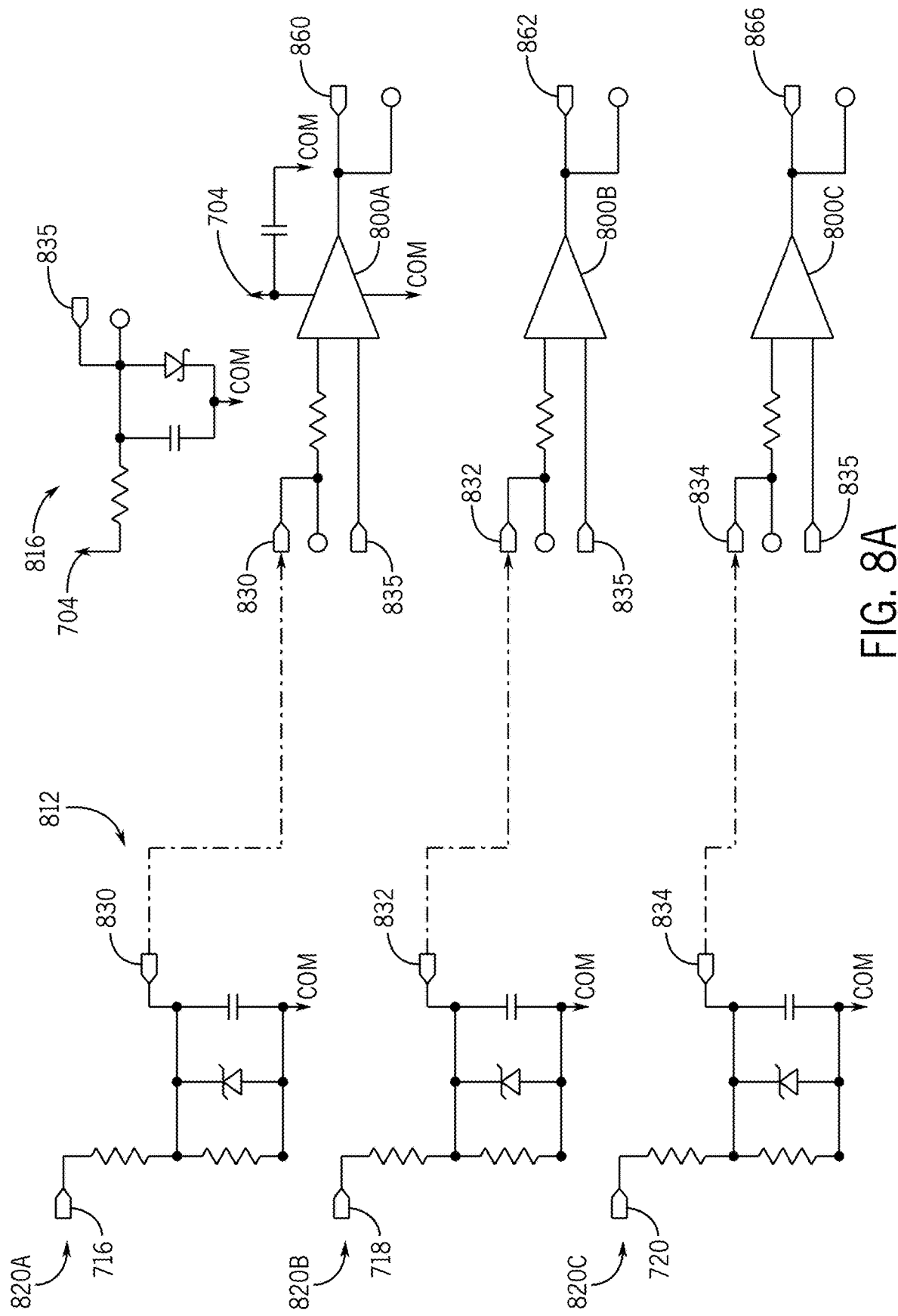
FIG. 8A shows an exemplary phase voltage divider and an exemplary phase detection circuit of the ECU of FIG. 3.

In particular, referring to FIG. 8A, the phase signals PHASE1, PHASE2, PHASE3 generated by the rectification circuit 700 to represent each phase of the three-phase power may be delivered to a phase detection section 814 that, in some embodiments, includes a phase voltage divider 812 and a phase detection circuit 816. The phase voltage divider 812 may include a discrete voltage dividing circuit for each of the phases, such as a first phase voltage dividing circuit 820A, a second phase voltage dividing circuit 820B, and a third phase voltage dividing circuit 820C; a voltage dividing circuit receives one of the phase signals PHASE1, PHASE2, PHASE3 and produces a phase detection input signal representing the corresponding phase of the input power. The first phase voltage diving circuit 820A can output a first detection phase PHASE_DETECT_1 at a first phase detection net 830. The second phase voltage diving circuit 820B can output a second detection phase PHASE_DETECT_2 at a second phase detection net 832. The third phase voltage diving circuit 820C can output a third detection phase PHASE_DETECT_3 at a third phase detection net 834. In some embodiments, the voltage divider may reduce voltage of the phase signals PHASE1, PHASE2, PHASE3 to produce the corresponding phase detection input signals PHASE_DETECT_1, PHASE_DETECT_2, PHASE_DETECT_3 at a voltage level that the processor can read and use for phase correction and identification of a missing phase, as described herein. The phase detection circuit 816 receives the phase detection input signals PHASE_DETECT_1, PHASE_DETECT_2, PHASE_DETECT_3. The phase detection circuit can generate (e.g., from an onboard low-voltage (3.3 VDC) input power produced by the rectification circuit 700) a reference voltage VREF at a reference voltage net 835 for comparison to the phase detection input signals. The reference voltage VREF can be used for comparing all phase detection input signals PHASE_DETECT_1, PHASE_DETECT_2, PHASE_DETECT_3. The reference voltage may be very low (e.g., 0.2V) so that low-power, high-sensitivity op-amp comparators 800A-C may be used in the circuit. A phase detection input signal, for example the first detection phase PHASE_DETECT_1, and a reference voltage signal are fed into a comparator to produce a phase sequence signal for each of the phases, indicating the order of the phase. A first phase sequence signal DI_PH_SEQ1 corresponding to the first phase can be produced at first phase sequence net 860, a second phase sequence signal DI_PH_SEQ2 corresponding to the second phase can be produced at a second phase sequence net 862, and a third phase sequence signal DI_PH_SEQ3 corresponding to the third phase can be produced at a third phase sequence net 866 and may be delivered to the ECU's microcontroller as described further below. As will be shown in FIG. 19, an analog 3.3 VDC voltage source can be provided at a sixth DC net 822 to certain subcircuits of the ECU such as those shown in FIG. 17.

Figure 8B:
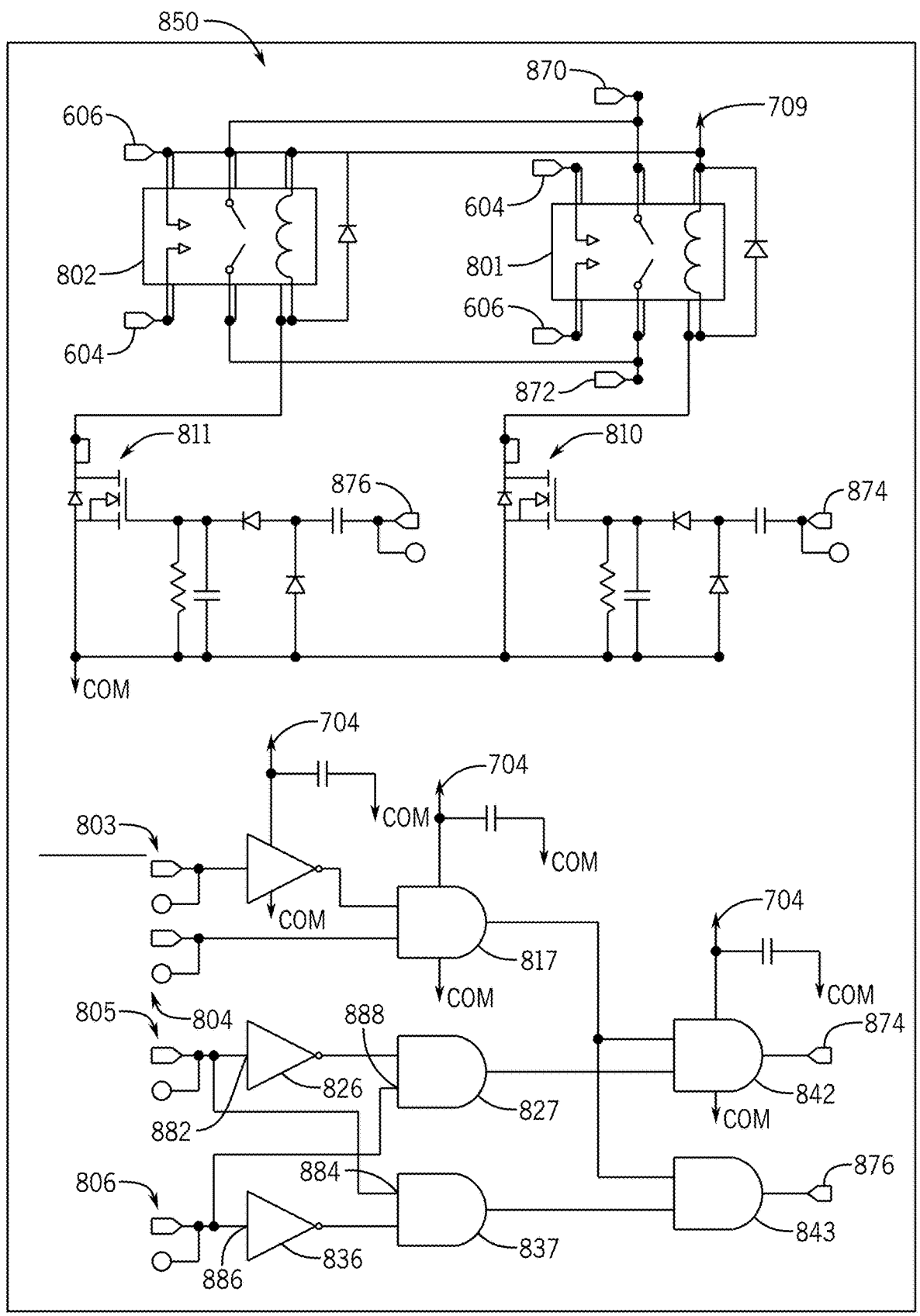
FIG. 8B shows an exemplary phase correction circuit of the ECU of FIG. 3.

Referring to FIG. 8B, a phase correction circuit 850 of the ECU can detect and automatically correct variations in the phase sequence, so that a clean input phase voltage can be delivered to the air conditioner. The phase correction circuit 850 receives two of the three phases of input power and activates an appropriate relay such as a forward phase relay 801 or a reverse phase relay 802 of a phase relay circuit, based on the input power connection and further based on whether the circuit breaker is correctly wired to the air conditioner. Specifically, the second phase L2_MAINS and the third phase L3 MAINS are used to generate a corrected second phase L2_CORRECTED at a corrected second phase net 870 and a corrected third phase L3_CORRECT at a corrected third phase net 872. A monitoring input signal at a watchdog net 803 is a watchdog signal coming from the microprocessor. A pulse width modulated (PWM) input signal at a PWM net 804 is a PWM signal that pulses to turn on either switch 810 for the forward phase relay 801 or switch 811 for the reverse phase relay 802. A reverse command signal DO_PH_REV signal at a first digital logic net 805 is the logic (digital) signal that outputs from the microcontroller (0 or 1) to turn on/off the reverse phase relay 802; a forward command signal DO_PH_FWD at a second digital logic net 806 is the logic (digital) signal that outputs from the microcontroller (0 or 1) to turn on/off the forward phase relay 801.

The control signals PH_FWD_RELAY, which may be referred to as a forward relay control signal, and PH_REV_RELAY, which may be referred to as a reverse relay control signal, are passed through electrical connections at a forward relay control net 874 and at a second relay control net 876 and into the phase relay circuit, where they control the switches 810, 811 to turn on/off the respective phase relay 801, 802. According to the design, there are two methods of controlling the two phase relays 801, 802 that prevent the phase relays 801, 802 from activating or deactivating at the same time. A first method relies on the firmware embedded in the microcontroller. The microcontroller will initialize the power that first applies to the controller or air conditioner, which is depended on the wiring from the main circuit breaker to the air conditioner: if the wires are installed correctly (i.e., phase matched) from the circuit breaker to the air conditioner, the microcontroller will activate the forward relay 801 by activating the forward command signal DO_PH_FWD at the net 806; if the wires are installed incorrectly from the circuit breaker to the air conditioner (e.g., hot and neutral wires are attached to different phases), the microcontroller will activate the reverse relay 802 by activating the reverse command signal DO_PH_REV at the net 805. The forward and reverse command signals are used by the microcontroller to activate the forward control signal PH_FWD_RELAY and the reverse control signal PH_REV_RELAY, A variation on this operational scheme calls a hardware control method ensuring that only one phase relay 801, 802 activates, even if the microcontroller fails to initiate the correct operation (or is not programmed to perform the first method above). There are few possibilities that the microcontroller outputs the wrong message or signal to the logic circuit, such as due to malfunction and/or firmware bug (glitch). The main hardware configuration that prevents the two phase relays 801, 802 from activating at the same time when firmware failed to cooperate correctly which relates to the input wirings as illustrated in FIGS. 2 & 3 above. The two nets that are connected from a first input pin 882 (input side of inverter 826) to a second input pin 884 (input side of AND gate 837) and a third input pin 886 (input side of inverter 836) to a fourth input pin 888 (input side of AND gate 827). This controlling scheme is to make sure that a first group of and gates formed by AND gates 817, 827, 837 logically outputs the correct signal to a second group of and gates formed by AND gates 842, 843 to activate only one of the phase relays 801, 802, which is either the forward phase relay 801 or the reverse phase relay 802 depending on the input power connection. These two nets are the main prevention signals to avoid forward and reverse relay turning on at the same time, especially when both the forward command signal DO_PH_FWD and the reverse command signal DO_PH_REV are activated, which results in neither relay being activated.

Figure 9:
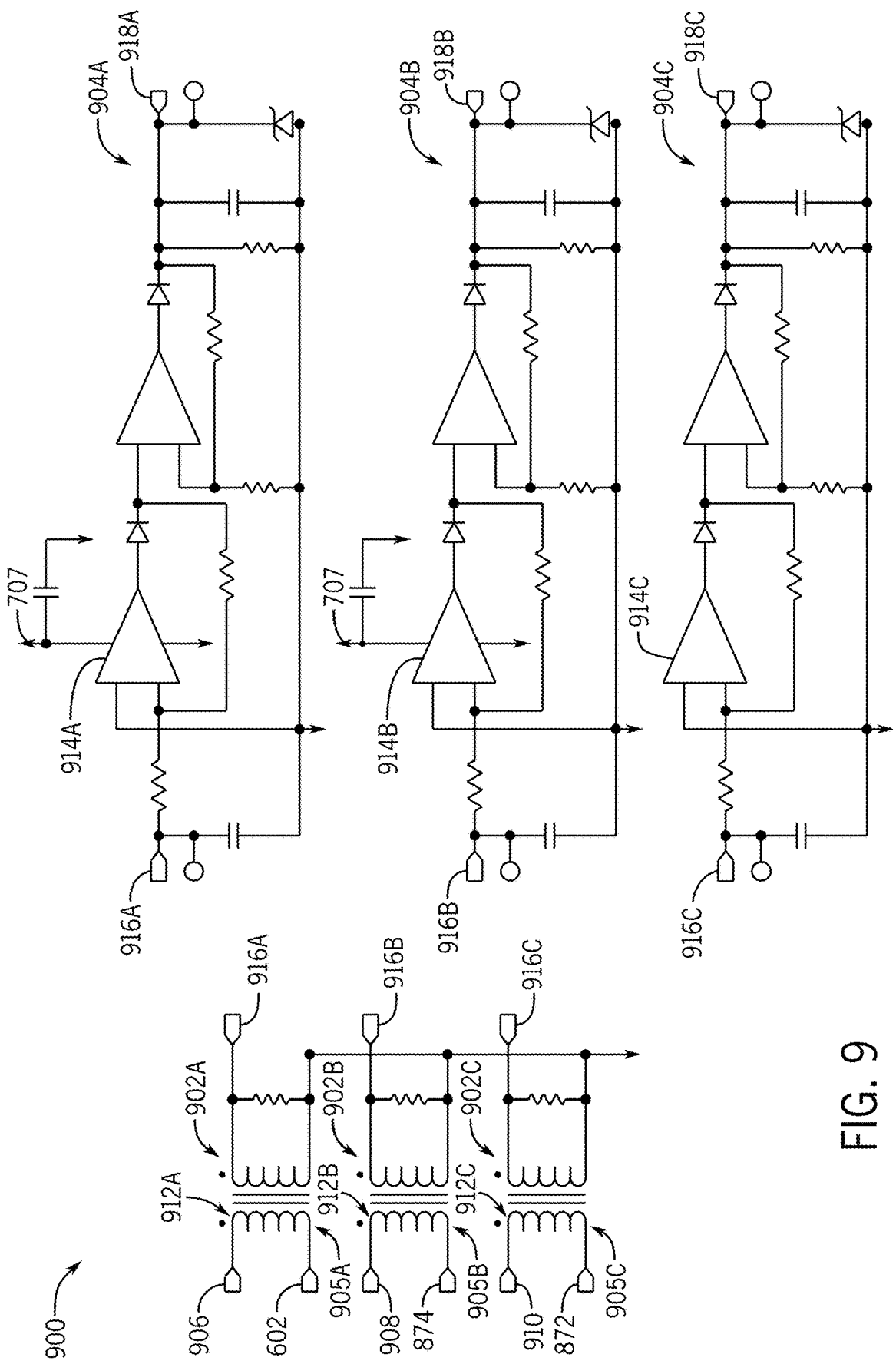
FIG. 9 shows an exemplary current sensing circuit of the ECU of FIG. 3.

Referring to FIG. 9, the ECU may include a current sensing circuit 900 that receives the first phase and the corrected second and third phases of the input power and produces a current signal for each phase; the current signal can be a digital (or more specifically, a microcontroller-readable) representation of the amplitude of the current for the corresponding phase. The phase inputs may be delivered to the corresponding current sensing transformers to normalize the phase current for use in the current sensing circuit; this may include attenuating or modulating the signal so that low-voltage (e.g., 6V) comparators 914A-C can be used. More specifically, the first phase L1_MAINS is passed to a first port 905A of a primary winding of a first current sensing transformer 902A, the corrected second phase L2_CORRECTED is passed to a first port 905B of primary winding of a second current sensing transformer 902B, and the corrected third phase L3_CORRECTED is passed to a first port 905C of a primary winding of a third current sensing transformer 902C. A first output phase L1_OUT generated at a first output net 906, a second output phase L2_OUT generated at a second output net 908, and a third output phase L3_OUT generated at a third output net 910 are passed are from second ports 912A-C of the primary winding of the current sensing transformers 902A-C respectively to a compressor control circuit which will be described below. In this way, the ECU (and more specifically the microcontroller) can estimate the amount of current passed to the compressor and determine if an overcurrent condition has occurred. Each phase current is then passed into its own independent current sensor 904A-C, which includes one or more diodes configured to convert the analog three-phase phase current signal (CT1_OUT, CT2_OUT, CT3_OUT) generated at analog phase current nets 916A-C into a digital three-phase current signal (ADC_CT1, ADC_CT2, ADC_CT3) at digital phase current nets 918A-C. The digital three-phase current signal can include a first digital current signal ADC_CT1 generated at a first digital phase current nets 918A, a second digital current signal ADC_CT2 generated at a second digital phase current net 918B, and a third digital current signal ADC_CT3 generated at a third digital phase current net 918C. The digital three-phase current signal may track the amplitude of the current, and further may indicate whether each phase current is present in the analog current signal. A microcontroller (not shown, see e.g. FIG. 19) coupled to the current sensing circuit 900 can determine faults based on the digital three-phase current signal. For example, the microcontroller can determine that an overcurrent condition has occurred by comparing one or more of the digital current signals ADC_CT1, ADC_CT2, ADC_CT3 to a predetermined threshold representing an overcurrent condition. If one or more of the digital current signals ADC_CT1, ADC_CT2, ADC_CT3 are above the predetermined threshold, the microcontroller can output an alarm.

Figure 10:
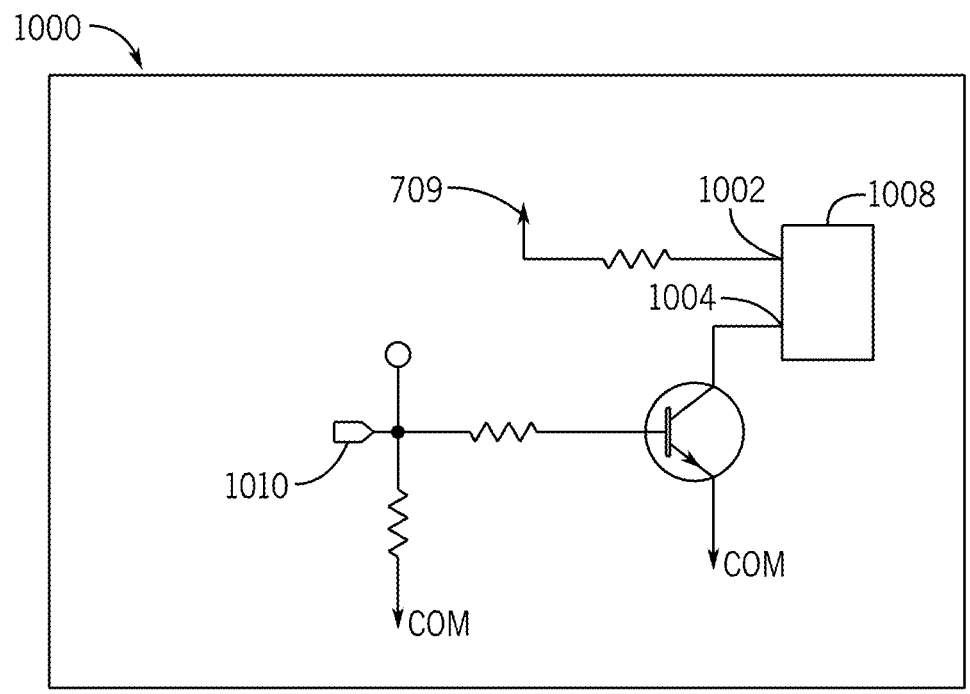
FIG. 10 shows an exemplary heater control circuit of the ECU of FIG. 3

FIG. 10 illustrates a heater control circuit 1000 that receives a control signal from the microcontroller to modify one or more settings that control operation of a heater in the air conditioner. The heater control circuit 1000 may additionally or alternatively electrically connect to an electric heater control interface. More specifically, the heater control circuit can provide a 12 VDC voltage source at a first pin 1002 of a connector 1008 and an on/off signal to the heater at a second pin 1004 at connector 1008. The heater control circuit 1000 can receive a heater control signal DO_HEAT_CTRL from the microcontroller at heater control net 1010. The heater control signal DO_HEAT_CTRL can then modulate the on/off signal at connector 1008.

Figure 11:
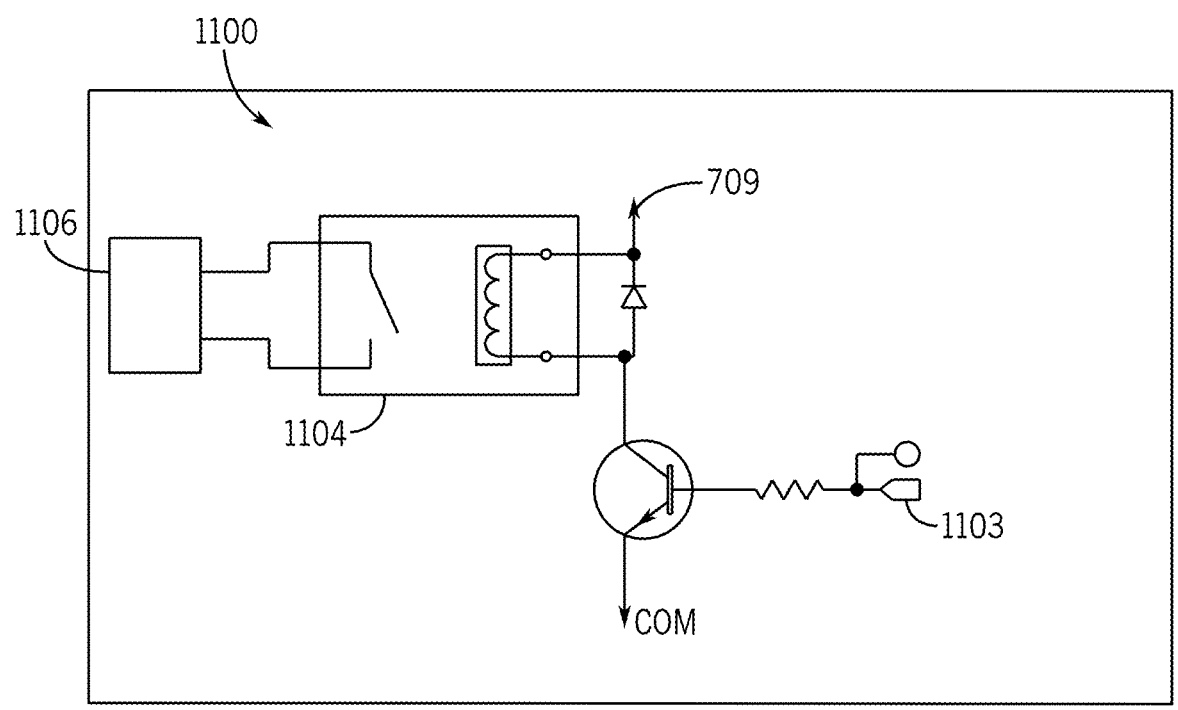
FIG. 11 shows an exemplary alarm output circuit of the ECU of FIG. 3.

FIG. 11 illustrates an alarm output circuit 1100 that receives a control signal from the microcontroller to generate one or more alarms. The alarm output circuit 1100 may output an alarm signal to an alarming device interface, such as a jumper or connector 1106 for receiving a cable connector of a loudspeaker, warning light, display device, wired or wireless transmitter, or another alarming device. Various faults may be signaled to end-users through the alarm output circuit when faults occur; non-limiting examples of alarms include missing phase alarm, imbalance phase alarm, compressor overcurrent alarm, compressor thermal overload alarm, door open alarm, high/low temperature alarm, frost alarm, enclosure air inlet temperature sensor failure alarm, enclosure air outlet temperature sensor failure alarm, condenser coil temperature sensor alarm, high pressure alarm, low pressure alarm, seriously high pressure shutdown alarm, and the like. The microcontroller can output an alarm signal DO_ALARM_OUT at net 1103 after a fault has been determined. The alarm signal DO_ALARM_OUT can cause an alarm relay 1104 to close, causing both ports of the connector 1106 to short and activate the alarming device interface.

Figure 12:
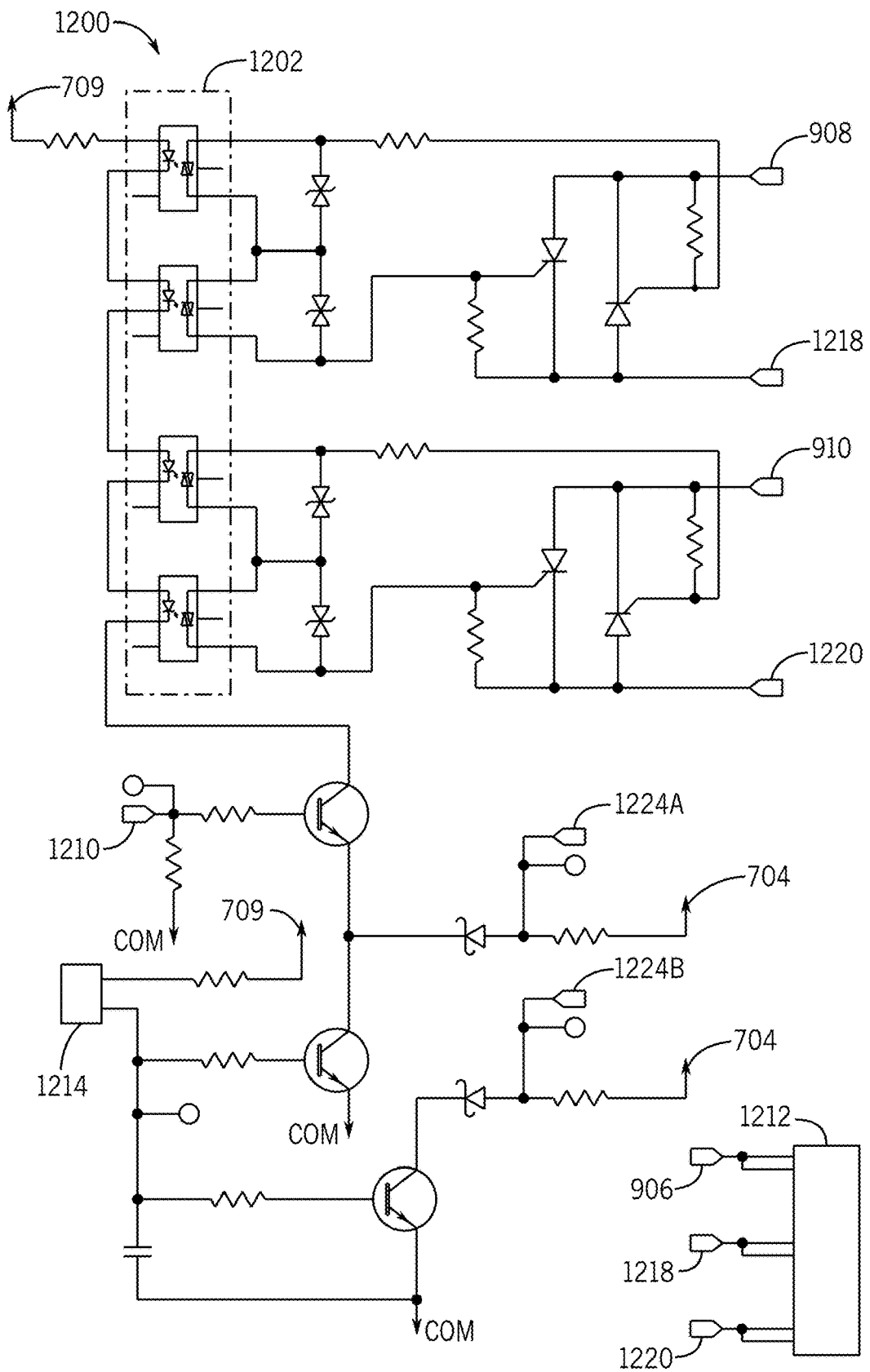
FIG. 12 shows an exemplary compressor control circuit of the ECU of FIG. 3.

FIG. 12 illustrates a compressor control circuit 1200 for starting and stopping the supply of power to the compressor. The circuit may be connected to the primary windings of the second and third phase current sensing transformers 902B-C of the current sensing circuit 900. Optocouplers 1202 or another suitable set of switches may activate in response to a "power on" state of a control signal (DO_COMP_CTRL) from the microcontroller at a control signal net 1210, allowing the corrected current from the transformers to be converted to the second and third phases of a power supply to the compressor. The first output phase L1_OUT (which acts as a first compressor current signal, i.e. the first phase supplied to the compressor) from the first current sensing transformer 902A, a second compressor current signal L2_COMP output at a second compressor signal net 1218, and a third phase compressor current signal L3_COMP output at a third compressor signal net 1220, may be delivered to a jumper or other connector 1212 that receives the power cable connector of the compressor. Another connector 1214 may receive one or more signals from one or more thermal sensors positioned on the compressor. The thermal sensors may detect temperature or pressure at various locations on the compressor; in some embodiments, the sensors may send a signal when detected conditions indicate that a compressor thermal overload is occurring or imminent. The compressor control circuit 1200 may process the sensor signal(s) and control the optocouplers 1202 to deactivate, stopping power to the compressor. Additionally or alternatively, the circuit may generate one or more compressor overload signals (DI_COMP_OVRLOAD1, DI_COMP_OVRLOAD2) at compressor overload nets 1224A and 1224B respectively and send them to the microcontroller for processing (e.g., into alerts).

Figure 13:
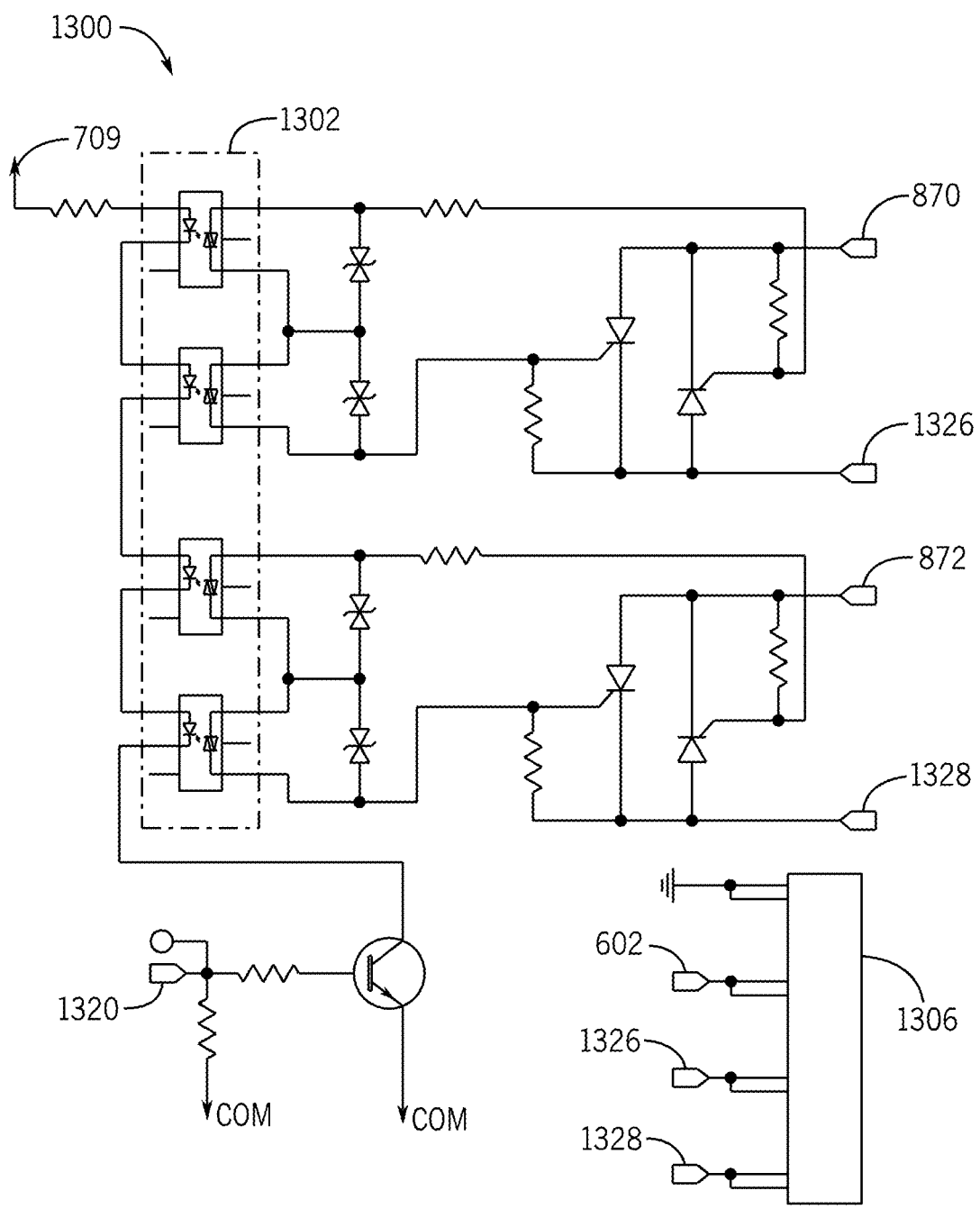
FIG. 13 shows an exemplary impeller control circuit of the ECU of FIG. 3.

FIG. 13 illustrates an impeller control circuit 1300 for starting and stopping the supply of power to any of one or more fans or other impellers in the air conditioning system. In particular the illustrated circuit controls power to a condenser fan (or condenser motor impeller) connected by a power supply cable to a jumper or other connector 1306 that serves as the condenser MI interface on the circuit board 100 of FIG. 1. The impeller control circuit 1300 may be connected to the primary windings of the second and third phase current sensing transformers 902B-C of the current sensing circuit 900 and/or the phase correction circuit 850. More specifically, the impeller control circuit can be coupled to the corrected second phase L2_CORRECTED and the corrected third phase L3_CORRECTED. Optocouplers 1302 or another suitable set of switches may activate in response to a "power on" state of a control signal (DO_IMP2_CTRL) received from the microcontroller at impeller control net 1320, allowing the corrected current (i.e. the corrected second phase L2_CORRECTED and the corrected third phase L3_CORRECTED) from the transformers to be converted to a second impeller phase L2_IMP2 (at an impeller phase net 1326) and a third impeller phase L3_IMP2 phase (output at an impeller phase net 1328) of a power input signal delivered to the condenser fan. The first phase L1_MAINS, the second impeller phase L2_IMP2, and the third impeller phase L3_IMP2 may be delivered to condenser MI interface (i.e., at connector 1306).

Figure 14:
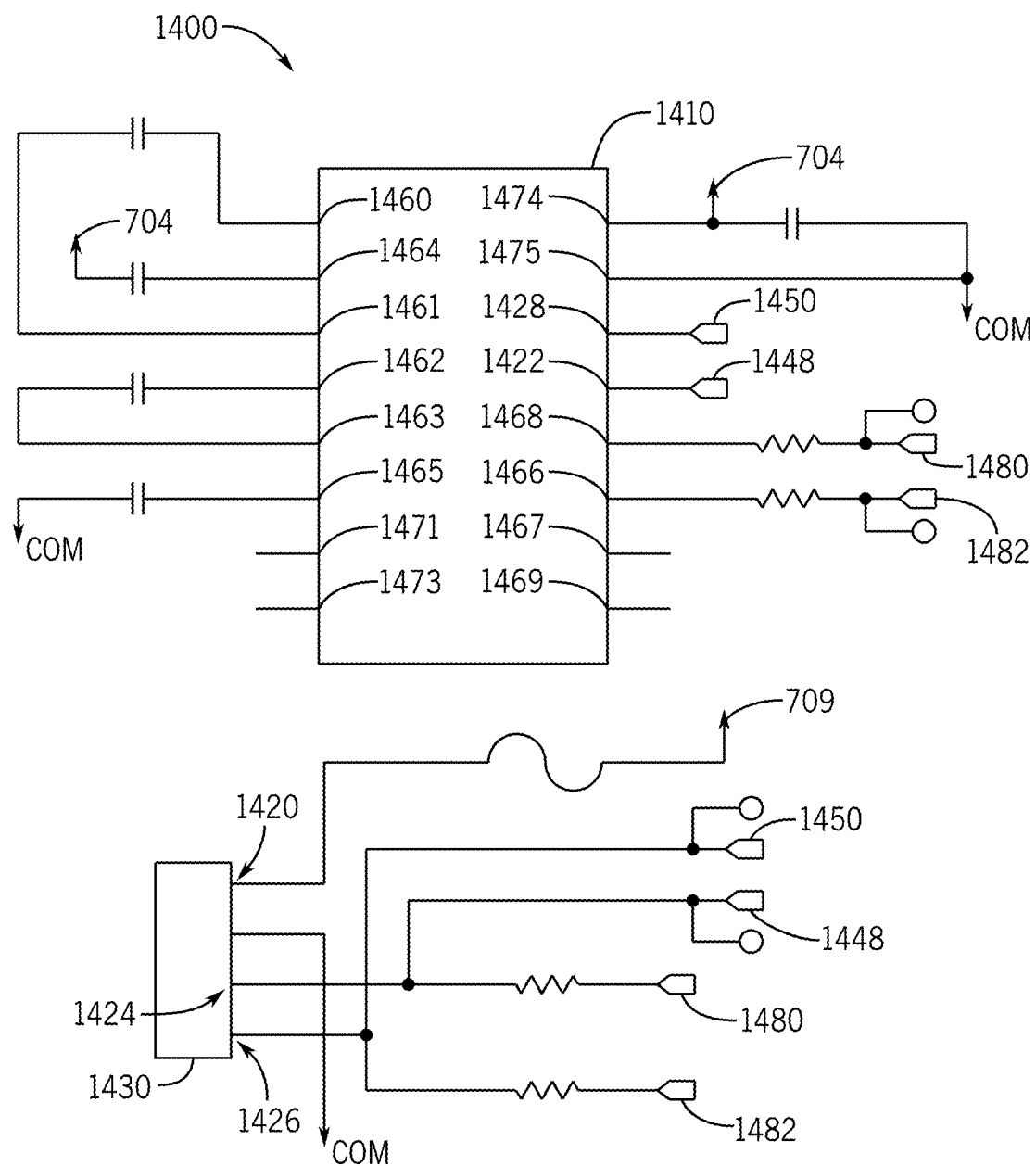
FIG. 14 shows an exemplary an ECU to display circuit of the ECU of FIG. 3

FIG. 14 illustrates an ECU to a display circuit 1400 for connecting the three-phase ECU to a display device connected to the board at jumper or other connector 1430. The connector 1430 may be any suitable communication port, such as a serial port as illustrated. An integrated transceiver 1410 is connected to the microcontroller in order to communicate data transmit and receive signals between the display and the microcontroller. For example, the transceiver 1410 may exchange data signals at TTL/CMOS level with the microcontroller; the transceiver 1410 may generate serial communication signals using a suitable protocol, such as RS-232, for exchanging data with the connected display device. The ECU may additionally provide input power to the display device through the connector 1430, such as a 12 VDC power supply generated by the ECU as described herein. The input power can be provided at a first port 1420 of the connector 1430. The integrated transceiver 1410 can be coupled to a second port 1424 of the connector 1430 outputting a receive RX signal. The second port 1424 can be coupled to a Net 1448 to provide the receive RX signal to a receive port 1422 (which can support RS-232 protocol) of the integrated transceiver 1410. Similarly, the integrated transceiver 1410 can be coupled to a third port 1426 of the connector 1430 to output a transmit TX signal. The third port 1426 can be coupled to a et 1450 to provide a receive TX signal to a transmit port 1428 (which can support RS-232 protocol) of the integrated transceiver 1410. In some embodiments, the integrated transceiver 1410 can be an Intersil ICL3232IVZ RS-232 transceiver. The integrated transceiver can include a plurality of connection points such as a first positive capacitor connection point C1+ 1460, a first negative capacitor connection point C1− 1461, a second positive capacitor connection point C2+ 1462, a second negative capacitor connection point C2− 1463, an internally generated positive transmitter supply V+ 1464, an internally generated negative transmitter supply V− 1465, a first TTL/CMOS level transmitter input T1IN 1466, a second TTL/CMOS level transmitter input T2IN 1467, a first TTL/CMOS level receiver output R1OUT 1468, a second TTL/CMOS level receiver output R2OUT 1469, a RS-232 transmitter output T2OUT 1471, a RS-232 receiver input R2IN 1473, and a power supply input VCC 1474, a ground connection point GND 1475. Transmitter inputs and receiver outputs can be coupled to the microcontroller, while transmitter outputs and receiver inputs can be coupled to the connector 1430 (and by extension the external display). The integral transceiver 1410 can output a display receive signal UART2_RX at net 1480 to the microcontroller via the receiver output R1OUT 1468. The integral transceiver 1410 can receive a display transmit signal UART2_TX at net 1482 to the microcontroller via the transmitter input T1IN 1466.

Figure 15:
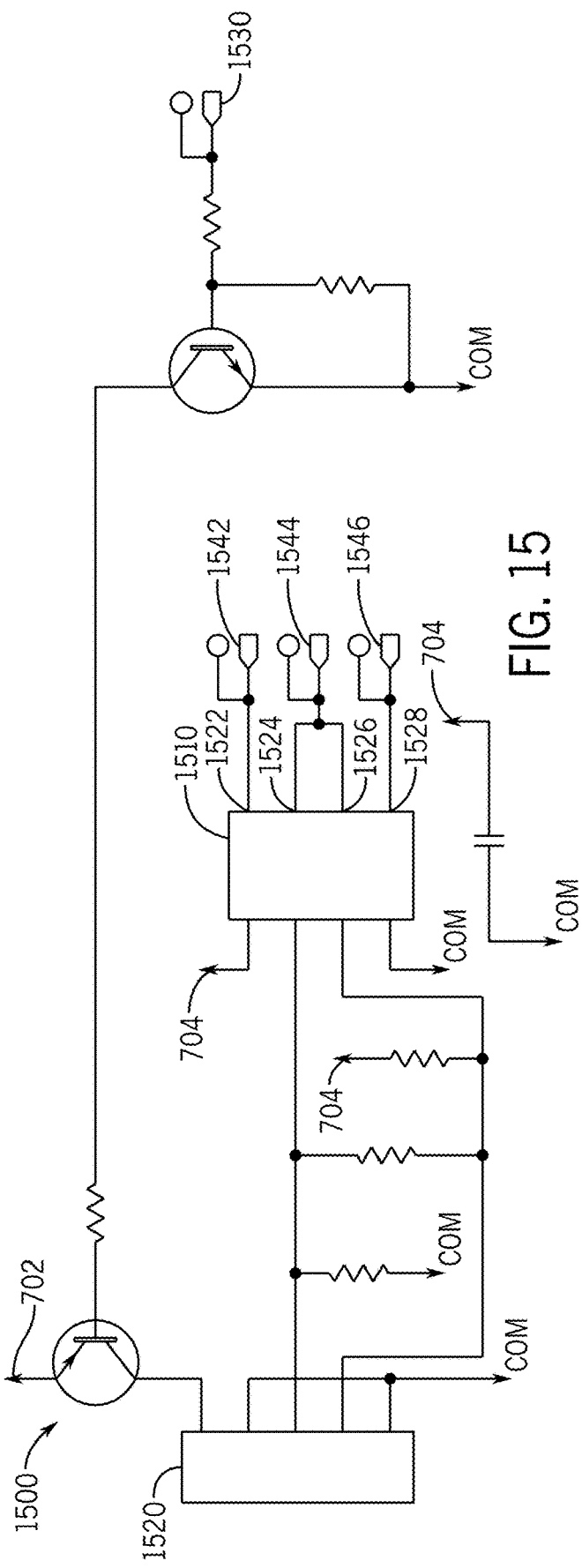
FIG. 15 shows an exemplary communication board circuit of the ECU of FIG. 3
Figure 16:
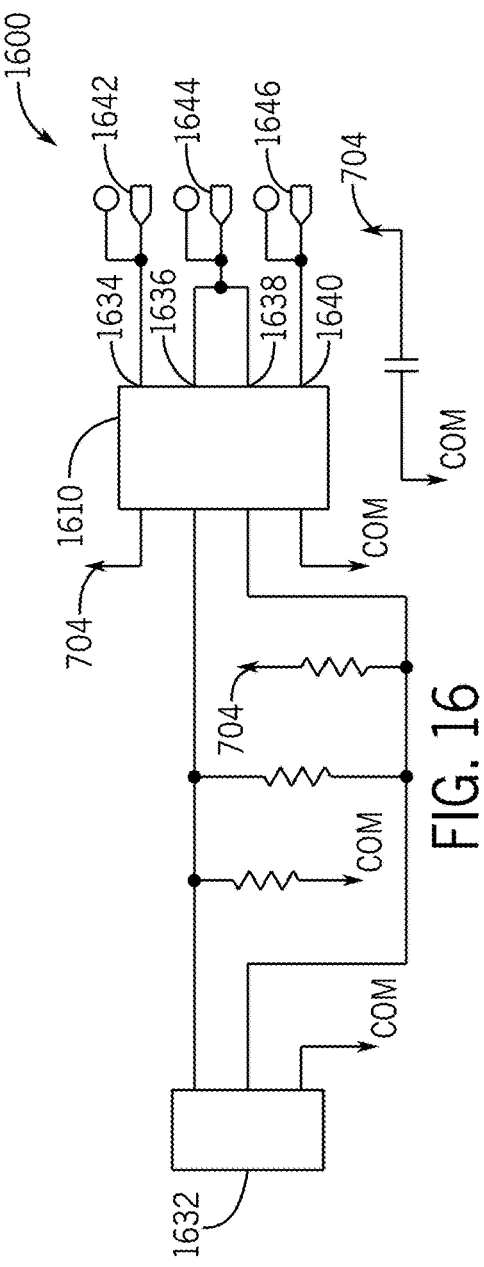
FIG. 16 shows an exemplary master/slave RS-485 circuit of the ECU of FIG. 3

FIGS. 15 and 16 illustrate circuits for additional data communication devices, which operate similarly to the circuitry illustrated in FIG. 14. In FIG. 15, a communication board circuit 1500 includes an integrated transceiver 1510 connected to the microcontroller and to a connector 1520 for a communication board communicates transmit and receive signals UART1_RX, UART1_TX/CTRL, and UART1_TX (at nets 1542, 1544, and 1546 respectively) between the communication board and the microcontroller at ports RO 1522, RE 1524, DE 1526, and DI 1528 of the integrated transceiver 1510; a control signal (DO_CB_ENABLE) from the microcontroller at net 1530 determines whether input power is supplied to the connected communication board through the connector 1520 from the DC_OUTPUT signal.

In FIG. 16, a master/slave RS-485 circuit 1600 includes an integrated transceiver 1610 connected to the microcontroller and to a connector 1632 for an RS-485—enabled device communicates transmit and receive signals UART0_RX, UART0_TX/CTRL, and UART0_TX (at nets 1642, 1644, and 1646 respectively) between the device and the microcontroller at ports RO 1634, $\overline{\text{RE}}$ 1636, DE 1638, and DI 1640 of the integrated transceiver 1610.

Figure 17:
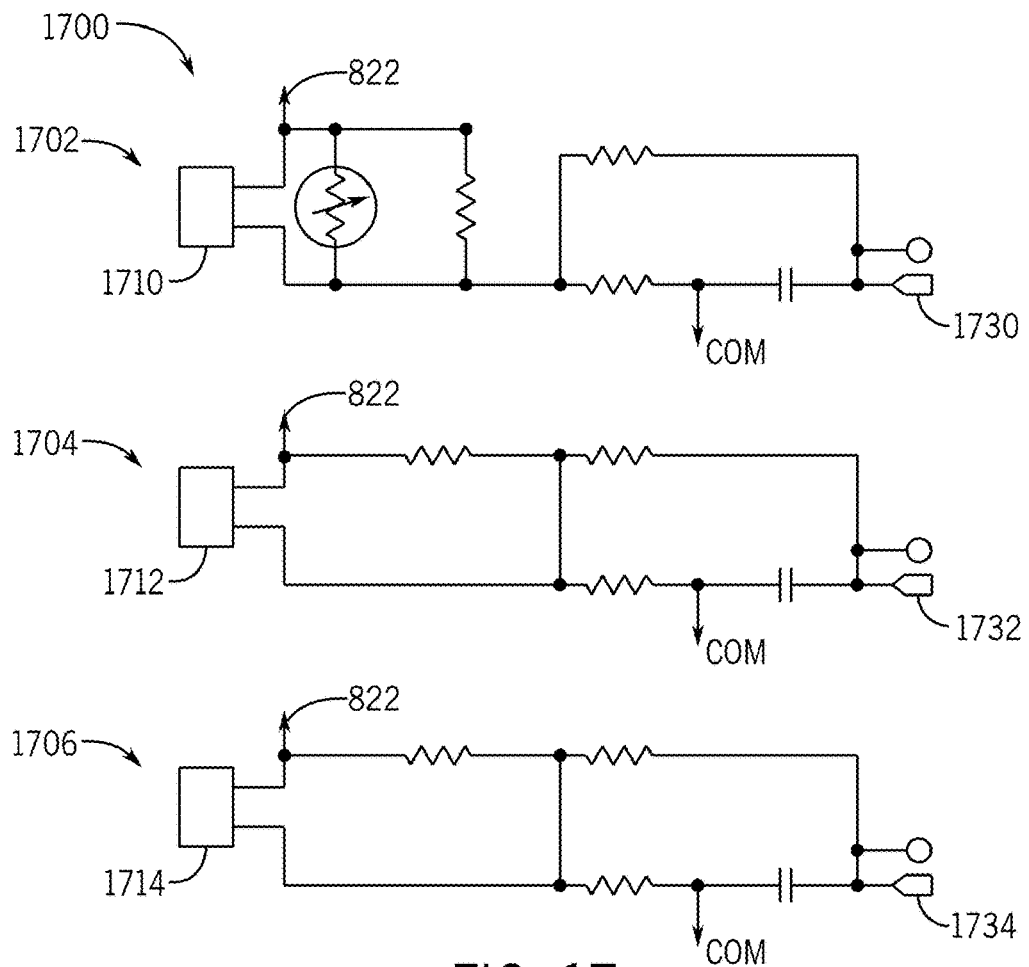
FIG. 17 shows an exemplary temperature sensor circuit of the ECU of FIG. 3
Figure 18:
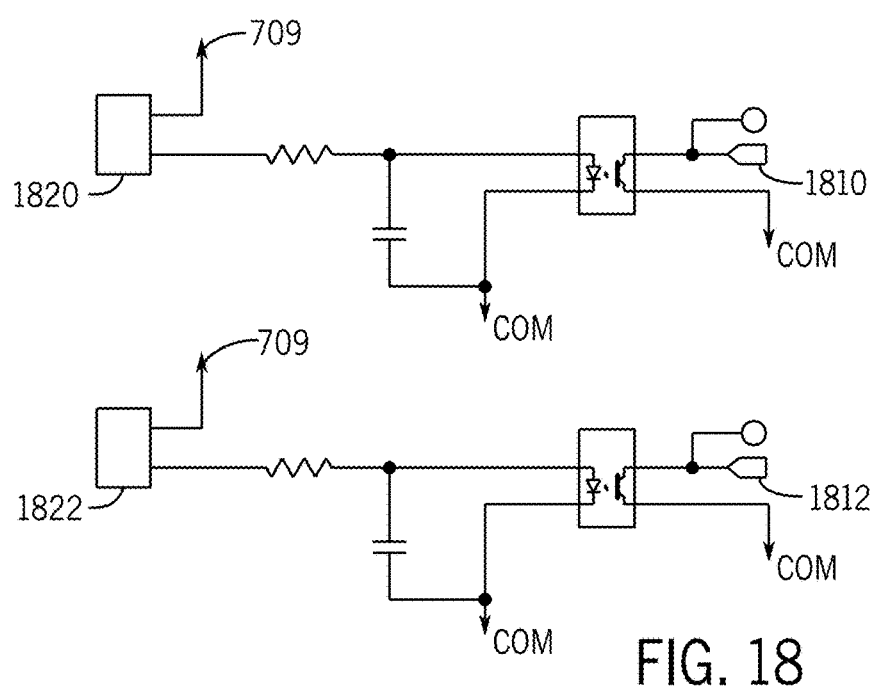
FIG. 18 shows exemplary external input circuits of the ECU of FIG. 3

FIGS. 17 and 18 illustrate example monitoring circuits for various hazardous conditions that may warrant alarm generation as described above; the circuits generally receive signals from connected sensors and deliver the signal information to the microcontroller for processing. Where the input sensor signals are analog, the circuit(s) may convert them to digital sensor signals. The example of FIG. 17 shows analog-to-digital conversion and reporting of temperature data recorded by sensors in a plurality of (e.g., three) distinct zones, which may be ambient/environmental zones, enclosure zones (i.e., within the enclosure), equipment-specific zones, or a combination thereof. The ECU can include a temperature sensor circuit 1700 that includes three temperature sensor input sub circuits: a first temperature sensor input sub circuit 1702 including connector 1710, a second temperature sensor input sub circuit 1704 including connector 1712, and a third temperature sensor input sub circuit 1706 including connector 1714, although it is understood that other numbers of temperature sensor input circuits can be used. Each temperature sensor input circuit can be coupled to the microcontroller in order to provide an environmental temperature signal to the microcontroller that indicates a temperature of a temperature sensor coupled to the temperature sensor input circuit. The first temperature sensor input sub circuit 1702 can provide a first environmental temperature signal ADC_TEMP1 to the microcontroller at a first temperature signal net 1730, the second temperature sensor input sub circuit 1704 can provide a second environmental temperature signal ADC_TEMP2 to the microcontroller at a second temperature signal net 1732, and a temperature sensor input sub circuit 1706 can provide a third environmental temperature signal ADC_TEMP3 to the microcontroller at a third temperature signal net 1734.

FIG. 18 shows examples of receiving and reporting other sensed data, such as various external conditions. In particular, the illustrated circuits process a signal from a sensor coupled to a connector included in the ECU. The circuits can minimally process the signal in order to make the signal readable by the microcontroller before outputting the signal to the microcontroller. In this way, the microcontroller can be coupled to a variety of sensors in order to receive sensor signals. A first external input circuit 1800 can include an optocoupler 1801 that can receive a door switch signal from a door switch switch sensor that is coupled to the connector 1820. The door switch sensor can detect when the enclosure door is opened. The otptocoupler 1801 can then output a corresponding door switch signal DI_DOOR_SMOKE at a first external input net 1810 in a format that is readable by the microcontroller. A second external input circuit 1803 can include a second optocoupler 1802 that can receive a digital input signal from a digital sensor that is and coupled to a connector 1822 and connected to the digital input interface described above with respect to FIG. 1. The second optocoupler 1802 can receive the digital input signal and output a corresponding digital input signal DI DISABLE at a second external input net 1812 in a format that is readable by the microcontroller. Other sensor types that can be coupled to the connectors 1820 or 1822 and configured to output signals include smoke detectors, pressure sensors, humidity sensors, and other sensors capable of sensing conditions that may adversely affect operation of a cooling unit coupled to the ECU.

Figure 19:
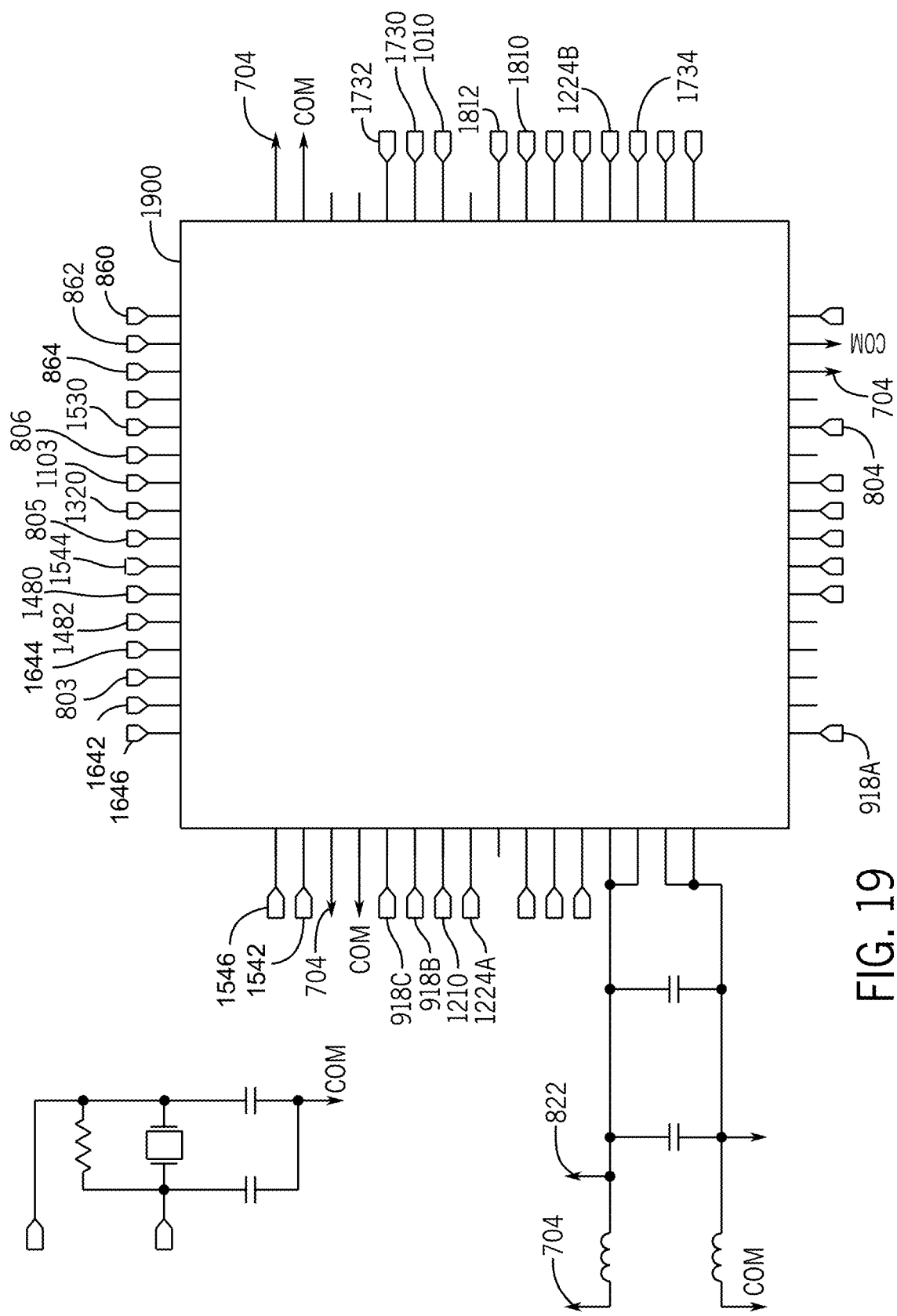
FIG. 19 shows an exemplary microcontroller of the ECU of FIG. 3

FIG. 19 illustrates an exemplary microcontroller 1900 that processes input signals from sensors and user interfaces and generates control and transmission signals to control power supply to connected components and deliver alarms and other information to users. For example, the microcontroller 1900 can use environmental temperature signals to automatically adjust the control signal (DO_IMP2_CTRL that controls the impeller, as shown in some of the circuits described above. In another example, the microcontroller 1900 can determine from compressor temperature and/or current signal(s) whether to generate an alert to an operator that the compressor is in a thermal overload condition or an overcurrent condition. The microcontroller 1900 can similarly monitor other parameters of the input power signal, the air conditioner, and/or the controller, including without limitation the input power phases; the microcontroller 1900 can control phase correction as described above. The microcontroller 1900 can generate one or more audible or visual alarms if any of the monitored signals is outside of a preset range, using an alarm output circuit such as that of FIG. 11. The microcontroller 1900 can communicate with one or more communication modules that enable remote access and control. The communication modules can communicate with a user device using any suitable protocol, such as SNMP or modbus TCP protocol. The controller can additionally or alternatively include one or more communication modules that enable the microcontroller 1900 to communicate with other cooling unit controllers in a network. Any suitable communication module can be used, such as an RS-485 converter.

The microcontroller 1900 can be coupled to the rectification circuit 700 of FIG. 7 in order to receive an input DC power source, which can be 3.3 VDC. The microcontroller 1900 can be coupled to the phase detection circuit 816 in order to receive the phase sequence signals DI_PH_SEQ1, DI_PH_SEQ2, and DI_PH_SEQ3. The microcontroller 1900 can be coupled to the phase correction circuit 850 in order to provide the forward control signal DO_PH_FWD or a reverse command signal DO_PH_REV to the phase correction circuit 850. The microcontroller can determine a phase order based on the phase sequence signals DI_PH_SEQ1, DI_PH_SEQ2, and DI_PH_SEQ3 and activate either the forward control signal DO_PH_FWD or a reverse command signal DO_PH_REV accordingly to provide the correct phase order to components of the ECU such as the compressor and impeller motor. The microcontroller 1900 can be coupled to the current sensing circuit 900 in order to receive the digital current signals ADC_CT1, ADC_CT2, ADC_CT3, which can be used to determine faults as described above. The microcontroller 1900 can be coupled to the heater control circuit 1000 in order to provide the heater control signal DO_HEAT_CTRL to the heater control circuit 1000 and activate the heater as described above. The microcontroller can be coupled to the 1100 in order to provide the alarm signal DO_ALARM_OUT to the alarm output circuit 1100 and activate the alarming device interface as described above. The microcontroller 1900 can be coupled to a compressor control circuit 1200 in order to provide the control signal DO_COMP_CTRL to the compressor control circuit 1200 and start or stop the compressor as described above, as well as to receive compressor overload signals DI_COMP_OVRLOAD1 and DI_COMP_OVRLOAD2. The microcontroller 1900 can use the compressor overload signals DI_COMP_OVRLOAD1 and DI_COM- P_OVRLOAD2 to determine if a fault condition has been met. For example, the microcontroller 1900 can determine the compressor overload signal DI_COMP_OVRLOAD1 is above a predetermined threshold and activate the alarm signal DO_ALARM_OUT. The microcontroller 1900 can be coupled to the impeller control circuit 1300 in order to provide the control signal (DO_IMP2_CTRL) to the impeller control circuit 1300 in order to start and stop the impeller as described above. The microcontroller 1900 can be coupled to the ECU to the display circuit 1400 in order to provide communication between the microcontroller 1900 and the display device, and more specifically, to receive display receive signal UART2_RX and output the display transmit signal UART2_TX to the display interface. The microcontroller 1900 can be coupled to the communication board circuit 1500 in order to transmit and receive signals UART1_RX, UART1_TX/CTRL, and UART1_TX to and from the communication board. The microcontroller 1900 can be coupled to the master/slave RS-485 circuit 1600 in order to transmit and receive signals UART0_RX, UART0_TX/CTRL, and UART0_TX between the microcontroller 1900 and the RS-485 enabled device. The microcontroller 1900 can be coupled to the temperature temperature sensor circuit 1700 in order to receive the first environmental temperature signal ADC_TEMP1, the second environmental temperature signal ADC_TEMP2, and the third environmental temperature signal ADC_TEMP3. The microcontroller can determine one or more of the environmental temperature signals ADC_TEMP1, ADC_TEMP2, and/or ADC_TEMP3. Is above a predetermined threshold and output an alarm. The microcontroller 1900 can be coupled to the first external input circuit 1800 and the second external input circuit 1803 in order to receive the door switch signal DI_DOOR_SMOKE and the digital input signal DI DISABLE. The microcontroller 1900 can determine that the DI_DOOR_SMOKE is above a predetermined threshold (i.e. above zero if the signal is a digital signal) and that a door is open and output an alarm. The microcontroller 1900 can determine that the digital input signal DI DISABLE is above a predetermined threshold and output an alarm.

It will be appreciated by those skilled in the art that while the invention has been described above in connection with particular embodiments and examples, the invention is not necessarily so limited, and that numerous other embodiments, examples, uses, modifications and departures from the embodiments, examples and uses are intended to be encompassed by the claims attached hereto. The entire disclosure of each patent and publication cited herein is incorporated by reference, as if each such patent or publication were individually incorporated by reference herein. Various features and advantages of the invention are set forth in the following claims.

The invention claimed is:

1. A thermal management system for an enclosure containing electrical components, the thermal management system comprising:
   a cooling unit mounted on the enclosure such that the cooling unit cools an interior space of the enclosure, the cooling unit having an impeller and a compressor; and
   a control unit in electrical communication with the cooling unit and with a power supply that generates a three-phase alternating-current (AC) input power at an input voltage, the input power comprising a first phase, a second phase, and a third phase, the control unit comprising:
   a rectification circuit configured to receive the AC input power and rectify the AC input power to output a direct current (DC) output power having a rectified DC voltage;
   a phase detection circuit coupled to the rectification circuit and configured to output a plurality of phase sequence signals indicating an order of the first, second, and third phases, the plurality of phase sequence signals including a first phase signal representing the first phase, a second phase signal representing the second phase, and a third phase signal representing the third phase;
   a phase correction circuit comprising a first relay configured to receive the second phase and the third phase of the AC input power, and a second relay configured to receive the second phase and the third phase of the AC input power, the first and second relays being selectively activated to output a corrected second phase and a corrected third phase, the control unit providing to the cooling unit a corrected input power comprising the first phase, the corrected second phase, and the corrected third phase; and
   a microcontroller coupled to the phase detection circuit, the phase correction circuit, and the rectification circuit, the microcontroller configured to:
   receive the first phase signal, the second phase signal, and the third phase signal; and
   activate one of the first relay and the second relay based on the first phase signal, the second phase signal, and the third phase signal, wherein to activate one of the first relay and the second relay, the microcontroller sends to the phase correction circuit one or both of a forward command signal and a reverse command signal, and wherein the phase correction circuit is configured to:
   activate the first relay in response to the forward command signal;
   activate the second relay in response to the reverse command signal; and
   not activate either the first relay or the second relay when both the forward command signal and the reverse command signal are received.

2. The system of claim 1, wherein the control unit does not include a transformer with a primary winding that receives the AC input power and a secondary winding that provides the corrected input power to at least one of the compressor and the impeller.

3. The system of claim 1 further comprising a current sensing circuit coupled to the rectification circuit and to the phase correction circuit and receiving the first phase, the corrected second phase, and the corrected third phase, and configured to output a digital first phase signal corresponding to a first phase current amplitude, a digital second phase signal corresponding to a corrected second phase current amplitude, and a digital third phase signal corresponding to a corrected third phase current amplitude, and wherein the microcontroller is further configured to:
   receive the first digital current signal;
   receive the second digital current signal;
   receive the third digital current signal;
   determine at least one of the first digital current signal, the second digital current signal, and the third digital current signal are above a predetermined threshold; and
   determine an overcurrent fault has occurred.

4. The system of claim 3, further comprising a compressor control circuit comprising at least one switch and coupled to the phase correction circuit and to the microcontroller, the compressor control circuit receiving the corrected second phase and the corrected third phase and configured to selectively provide the corrected second phase and the corrected third phase to the compressor in response to a compressor control signal received from the microcontroller.

5. The system of claim 4, wherein the current sensing circuit comprises a current sensor comprising a comparator coupled to the rectification circuit.

6. The system of claim 1, wherein the system further comprises a heater control circuit coupled to the microcontroller and configured to activate a heater in response to a heater control signal, wherein the microcontroller is configured to provide the heater control signal to the heater control circuit.

7. The system of claim 1, wherein the rectification circuit is configured to output a 3.3 VDC voltage supply, a 6 VDC voltage supply, a 12 VDC voltage supply, and a 24 VDC voltage supply.

8. The system of claim 7, wherein the phase detection circuit further comprises at least one op-amp, the phase detection circuit being configured to receive the 3.3 VDC voltage supply and produce a 0.2 VDC voltage supply, the 0.2 VDC voltage supply being coupled to the at least one op-amp, the op-amp configured to compare the 0.2 VDC voltage supply to the first phase.

9. The system of claim 8, wherein the input voltage is 460 VAC.

10. The system of claim 1, wherein the system further comprises a temperature sensor circuit coupled to a temperature sensor and the microcontroller and configured to output an environmental temperature signal to the microcontroller, and wherein the microcontroller is further configured to:
receive the environmental temperature signal;
determine that the environmental temperature signal is above a predetermined threshold; and
output an alarm.

11. A thermal management system for an enclosure containing electrical components, the thermal management system comprising:
a cooling unit mounted on the enclosure such that the cooling unit cools an interior space of the enclosure, the cooling unit having an impeller and a compressor; and
a control unit in electronic communication with the cooling unit and a power supply that generates a three-phase alternating-current (AC) input power at an input voltage, the AC input power comprising a first phase, a second phase, and a third phase, wherein the control unit does not include a transformer with a primary winding that receives the AC input power and a secondary winding that provides output power to at least one of the compressor and the impeller, the control unit comprising:
a phase correction circuit comprising a first relay configured to receive the second phase and the third phase of the AC input power, and a second relay configured to receive the second phase and the third phase of the AC input power, the first and second relays being selectively activated to output a corrected second phase and a corrected third phase, the control unit providing to the cooling unit a corrected input power comprising the first phase, the corrected second phase, and the corrected third phase; and
a microcontroller coupled to the phase correction circuit, wherein to activate one of the first relay and the second relay, the microcontroller sends to the phase correction circuit one or both of a forward command signal and a reverse command signal, and wherein the phase correction circuit is configured to:
activate the first relay in response to the forward command signal;
activate the second relay in response to the reverse command signal; and
not activate either the first relay or the second relay when both the forward command signal and the reverse command signal are received.

12. The system of claim 11, wherein the control unit further comprises
a rectification circuit configured to receive the AC input power and rectify the AC input power to output a direct current (DC) output power having a rectified DC voltage;
a phase detection circuit coupled to the rectification circuit and configured to output a plurality of phase sequence signals indicating an order of the first, second, and third phases, the plurality of phase sequence signals including a first phase signal representing the first phase, a second phase signal representing the second phase, and a third phase signal representing the third phase,
wherein the microcontroller is further coupled to the phase detection circuit and the rectification circuit, the microcontroller further configured to:
receive the first phase signal, the second phase signal, and the third phase signal; and
activate one of the first relay and the second relay based on the first phase signal, the second phase signal, and the third phase signal.

13. The system of claim 12 further comprising a current sensing circuit coupled to the rectification circuit and to the phase correction circuit and receiving the first phase, the corrected second phase, and the corrected third phase, and configured to output a digital first phase signal corresponding to a first phase current amplitude, a digital second phase signal corresponding to a corrected second phase current amplitude, and a digital third phase signal corresponding to a corrected third phase current amplitude, and wherein the microcontroller is further configured to:
receive the first digital current signal;
receive the second digital current signal;
receive the third digital current signal;
determine at least one of the first digital current signal, the second digital current signal, and the third digital current signal are above a predetermined threshold; and
determine an overcurrent fault has occurred.

14. The system of claim 13, further comprising a compressor control circuit comprising at least one switch and coupled to the phase correction circuit and to the microcontroller, the compressor control circuit receiving the corrected second phase and the corrected third phase and configured to selectively provide the corrected second phase and the corrected third phase to the compressor in response to a compressor control signal received from the microcontroller.

15. The system of claim 14, wherein the current sensing circuit comprises a current sensor comprising a comparator coupled to the rectification circuit.

16. The system of claim 12, wherein the system further comprises a heater control circuit coupled to the microcontroller and configured to activate a heater in response to a heater control signal, wherein the microcontroller is configured to provide the heater control signal to the heater control circuit.

17. The system of claim 13, wherein the rectification circuit is configured to output a 3.3 VDC voltage supply, a 6 VDC voltage supply, a 12 VDC voltage supply, and a 24 VDC voltage supply.

18. The system of claim 17, wherein the phase detection circuit further comprises at least one op-amp, the phase detection circuit being configured to receive the 3.3 VDC voltage supply and produce a 0.2 VDC voltage supply, the 0.2 VDC voltage supply being coupled to the at least one op-amp, the op-amp configured to compare the 0.2 VDC voltage supply to the first phase, and wherein the input voltage is 460 VAC.

19. A thermal management system for an enclosure containing electrical components, the thermal management system comprising:
   a cooling unit mounted on the enclosure such that the cooling unit cools an interior space of the enclosure, the cooling unit having an impeller and a compressor; and
   a control unit in electrical communication with the cooling unit and with a power supply that generates AC input power comprising a first phase, a second phase, and a third phase, the control unit comprising:
      a rectification circuit configured to receive the AC input power;
      a phase correction circuit comprising a first relay configured to receive the second phase and the third phase of the AC input power, and a second relay configured to receive the second phase and the third phase of the AC input power, the first and second relays being configured to output a corrected second phase and a corrected third phase;
      a current sensing circuit coupled to the rectification circuit and to the phase correction circuit and receiving the first phase, the corrected second phase, and the corrected third phase, and configured to output a digital first phase signal corresponding to a first phase current amplitude, a digital second phase signal corresponding to a corrected second phase current amplitude, and a digital third phase signal corresponding to a corrected third phase current amplitude; and
      a microcontroller coupled to the phase correction circuit and the rectification circuit, the microcontroller configured to:
      receive the first digital current signal;
      receive the second digital current signal;
      receive the third digital current signal;
      determine at least one of the first digital current signal, the second digital current signal, and the third digital current signal are above a predetermined threshold; and
      determine an overcurrent fault has occurred.

* * * * *